United States Patent
Bong

(10) Patent No.: US 9,549,442 B1
(45) Date of Patent: Jan. 17, 2017

(54) LIGHT EMITTING DEVICE (LED) DRIVING APPARATUS AND LIGHTING DEVICE INCLUDING THE SAME

(71) Applicant: Samsung Electronics Co., Ltd., Suwon-si (KR)

(72) Inventor: Sang Cheol Bong, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/086,450

(22) Filed: Mar. 31, 2016

(30) Foreign Application Priority Data

Jun. 26, 2015 (KR) .................. 10-2015-0091012

(51) Int. Cl.

| | |
|---|---|
| H05B 33/08 | (2006.01) |
| F21V 23/00 | (2015.01) |
| F21K 99/00 | (2016.01) |
| H05B 37/02 | (2006.01) |
| H01L 25/16 | (2006.01) |
| H01L 25/075 | (2006.01) |
| H01L 33/62 | (2010.01) |
| H01L 33/24 | (2010.01) |

(Continued)

(52) U.S. Cl.
CPC ............ H05B 33/0845 (2013.01); F21K 9/10 (2013.01); F21V 23/005 (2013.01); F21V 23/006 (2013.01); H01L 25/0753 (2013.01); H01L 25/167 (2013.01); H01L 33/62 (2013.01); H05B 33/083 (2013.01); H05B 33/0809 (2013.01); H05B 37/0272 (2013.01); H01L 33/007 (2013.01); H01L 33/06 (2013.01); H01L 33/12 (2013.01); H01L 33/24 (2013.01); H01L 33/325 (2013.01); H01L 33/405 (2013.01); H01L 33/42 (2013.01); H01L 33/502 (2013.01)

(58) Field of Classification Search
CPC ... H05B 37/02; H05B 37/029; H05B 33/0815; H05B 33/0827; H05B 33/083; H05B 33/0842; H05B 33/0824; H05B 33/0809; Y02B 20/346
USPC ............ 315/291, 294, 297, 307, 312, 185 R
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |

(Continued)

FOREIGN PATENT DOCUMENTS

| | | |
|---|---|---|
| JP | 2012-221599 | 11/2012 |
| KR | 10-2013-0091461 A | 2/2012 |

(Continued)

*Primary Examiner* — Haissa Philogene
(74) *Attorney, Agent, or Firm* — Muir Patent Law, PLLC

(57) ABSTRACT

A light emitting diode (LED) driving apparatus includes a power supply circuit configured to supply driving power to a plurality of LED arrays, a controller integrated circuit (IC) including a plurality of internal switches respectively connected to the plurality of LED arrays and configured to control a path of current flowing in the plurality of LED arrays by adjusting operations of the plurality of internal switches based on a magnitude of the driving power, and a current control circuit connected to an output terminal of a first LED array among the plurality of LED arrays and configured to adjust current flowing in the first LED array. The first LED array is constantly operated while the driving power is being supplied.

20 Claims, 23 Drawing Sheets

(51) Int. Cl.
*H01L 33/06* (2010.01)
*H01L 33/50* (2010.01)
*H01L 33/12* (2010.01)
*H01L 33/32* (2010.01)
*H01L 33/00* (2010.01)
*H01L 33/40* (2010.01)
*H01L 33/42* (2010.01)

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,902,771 B2 * | 3/2011 | Shteynberg | H05B 33/0815 315/185 R |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 8,933,636 B2 * | 1/2015 | Egawa | H05B 33/083 315/192 |
| 2010/0141162 A1 * | 6/2010 | Matsumoto | H05B 33/0818 315/186 |
| 2012/0249003 A1 | 10/2012 | Esaki et al. | |
| 2013/0026924 A1 | 1/2013 | Jong et al. | |
| 2013/0063033 A1 | 3/2013 | Deppe | |
| 2013/0093340 A1 | 4/2013 | Horino et al. | |
| 2014/0125238 A1 | 5/2014 | Kwon et al. | |

FOREIGN PATENT DOCUMENTS

| | | |
|---|---|---|
| KR | 10-2012-0043188 A | 5/2012 |
| KR | 10-2014-0057090 A | 5/2014 |
| KR | 10-2014-0136207 A | 11/2014 |
| KR | 10-2014-0144909 A | 12/2014 |
| KR | 10-2015-0010176 A | 1/2015 |
| KR | 10-2015-0031880 A | 3/2015 |

* cited by examiner

LIGHT EMITTING DEVICE (LED) DRIVING APPARATUS AND LIGHTING DEVICE INCLUDING THE SAME

CROSS-REFERENCE TO RELATED APPLICATION

This application claims the benefit of priority under U.S.C. §119 of Korean Patent Application No. 10-2015-0091012, filed on Jun. 26, 2015, with the Korean Intellectual Property Office, the disclosure of which is incorporated herein by reference in its entirety.

BACKGROUND

The present disclosure relates to a light emitting diode (LED) driving apparatus and lighting device including the same.

LEDs are semiconductor light emitting devices having advantages of low power consumption, long lifespan, and implementation of light in various colors, compared with existing light sources such as fluorescent or incandescent lamps. With such advantages, LEDs have been extended to apply to various lighting devices, backlight units of display devices, and headlamps of vehicles. In general, an LED is operated by a constant current, and thus, an LED driving apparatus includes a rectifying circuit for converting alternating current (AC) power into direct current (DC) power and a converter circuit generating constant power from an output of the rectifying circuit.

Recently, an LED driving apparatus able to operate an LED without using a converter circuit has been proposed to lower manufacturing costs and increase reliability by reducing the amount of circuit components. The LED driving apparatus without a converter circuit may include a controller IC having a plurality of switches and a plurality of LED arrays controlled in lighting by the controller IC. The LED driving apparatus without a converter circuit is advantageous in terms of high reliability and low manufacturing costs, but a flickering phenomenon can be caused due to a duration in which all the LED arrays do not emit light.

SUMMARY

An aspect of the present concepts may provide a light emitting diode (LED) driving apparatus in which an LED is driven with AC power without using an AC-DC converter circuit and a flickering phenomenon and a heating phenomenon are minimized, and a lighting device including the same.

According to an aspect of the present concepts, an LED driving apparatus may include: a power supply circuit configured to supply driving power to a plurality of LED arrays; a controller integrated circuit (IC) including a plurality of internal switches respectively connected to output terminals of the plurality of LED arrays, and configured to control a path of current flowing in the plurality of LED arrays by adjusting operations of the plurality of internal switches based on a magnitude of the driving power; and a current control circuit connected to an output terminal of a first LED array among the plurality of LED arrays and configured to adjust current flowing in the first LED array, wherein while the driving power is supplied, the first LED array is constantly driven.

According to another aspect of the present concepts, a lighting device may include: a light source including first to nth LED arrays sequentially connected in series; a power supply circuit having a rectifying circuit configured to rectify alternating current (AC) power and a compensation circuit configured to supply predetermined compensation power to the first LED array when an output voltage from the rectifying circuit is smaller than a minimum voltage required for driving the first LED array; a controller integrated circuit (IC) including first to nth internal switches respectively connected to output terminals of the first to nth LED arrays, and configured to control a path of current flowing in the first to nth LED array by adjusting operations of the first to nth internal switches based on a magnitude of a voltage supplied by the power supply circuit to the light source; and a current control circuit connected to the output terminal of the first LED array and configured to draw a portion of current flowing in the first LED array while the predetermined compensation power is supplied to the first LED array.

According to another aspect, the present disclosure is directed to a light emitting diode (LED) driving apparatus comprising: a power supply circuit configured to supply driving power to a first LED array and a second LED array; a controller integrated circuit (IC) including a first internal switch and a second internal switch and configured to control operations of the first internal switch and second internal switch based on a magnitude of the driving power; and a current control circuit connected to an output terminal of the first LED array and an output terminal of the second LED array and configured to adjust current flowing to the first LED array, wherein while the driving power is supplied, the first LED array is constantly driven.

The present disclosure further includes wherein the first LED array and the second LED array are connected in series.

The present disclosure further includes wherein the first internal switch is connected to the output terminal of the first LED array and the second internal switch is connected to the output terminal of the second LED array, wherein when the first internal switch is turned on, the current control circuit draws a portion of the current flowing to the first LED array, and wherein when the second internal switch is turned on, the current control circuit supplies the current flowing in the first LED array to the second LED array.

The present disclosure further includes wherein the power supply circuit includes a rectifying circuit configured to rectify alternating current (AC) power and a compensation circuit configured to supply predetermined compensation power to the first LED array when an output voltage from the rectifying circuit is smaller than a minimum voltage required for driving the first LED array.

The present disclosure further includes wherein a number of LEDs included in the first LED array is greater than a number of LEDs included in the second LED array.

BRIEF DESCRIPTION OF DRAWINGS

The above and other aspects, features, and advantages of the disclosed concepts will be more clearly understood from the following detailed description taken in conjunction with the accompanying drawings, in which.

DETAILED DESCRIPTION

Figure 1:
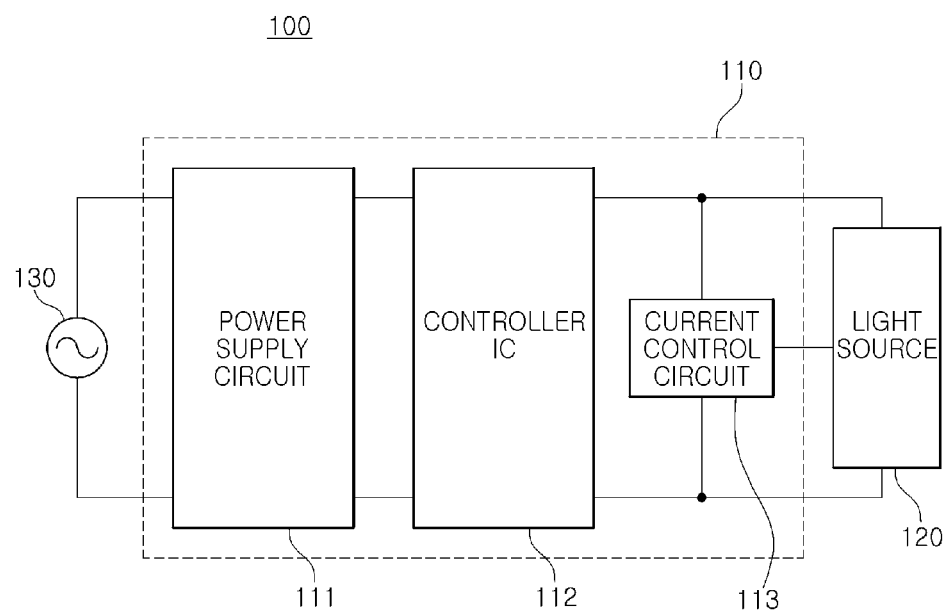
FIG. 1 is a block diagram illustrating a lighting device according to certain exemplary embodiments.

Hereinafter, exemplary embodiments of the present concepts will be described in detail with reference to the accompanying drawings. In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole.

Throughout the specification, it will be understood that when an element such as a film, a region, or a wafer (substrate) is referred to as being positioned to be "on" or "connected to" another element, it can be on, connected, or coupled to the other element, or intervening elements may be present. However, when an element is referred to as being positioned to be "directly on" or "directly connected to", or "directly coupled to" another element, or as "contacting" or "in contact with" another element, it will be understood that intervening elements are not present. The same reference numerals will be used throughout to designate the same or like elements. As used herein, the term and/or includes any and all combinations of one or more of the associated listed items.

Embodiments described herein will be described referring to plan views and/or cross-sectional views byway of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes.

Also, though terms like a first and a second are used to describe various members, components, regions, layers, and/or portions in various embodiments, the members, components, regions, layers, and/or portions are not limited to these terms. Unless the context indicates otherwise, these terms are used only to differentiate one member, component, region, layer, or portion from others thereof. Therefore, a member, a component, a region, a layer, or a portion referred to as a first member, a first component, a first region, a first layer, or a first portion in an embodiment may be referred to as a second member, a second component, a second region, a second layer, or a second portion in another embodiment.

Also, relative terms such as "on", "upper", "under", or "below" may be used to describe relationships of certain elements to other elements as depicted in the drawings. Relative terms may be understood as intending the inclusion of other directions of a device in addition to directions illustrated in the drawings. For example, when a device is turned over in the drawings, elements illustrated to be present on surfaces of other elements may be oriented under the foregoing other elements. For example, the term "on" may include both directions of "under" and "on" relying on a particular direction of drawings. When an element is oriented in a different direction (rotated by 90 degrees with respect to the different direction), relative descriptions used in this disclosure may be interpreted accordingly.

The technical terms used in this disclosure are only used for explaining a specific exemplary embodiment and are not intended to be limiting. The terms of a singular form may include plural forms unless referred to the contrary. Also, it will be further understood that the terms "comprise" and/or "comprising," when used herein, specify the presence of stated features, integers, steps, operations, elements, and/or components, but do not preclude the presence or addition of one or more other features, steps, operations, elements, components, and/or groups thereof. As used herein, the term "and/or" includes any and all combinations of one or more of the associated listed items. Also, the term "exemplary" is intended to refer to an example or illustration.

Hereinafter, exemplary embodiments will be described with reference to the accompanying drawings. In the accompanying drawings, for example, modifications of an illustrated shape may be expected according to manufacturing technology and/or tolerance. Therefore, embodiments disclosed herein should not be construed as being limited to a specific shape of a region illustrated in the drawing, and for example, should include a shape change caused in a manufacturing process. Hereinafter, one or a plurality of exemplary embodiments may be combined to be configured.

FIG. 1 is a block diagram illustrating a lighting device according to an exemplary embodiment.

Referring to FIG. 1, a lighting device 100 according to an exemplary embodiment may include a light emitting diode (LED) driving apparatus 110, a light source 120, and a power source 130. The power source 130 may be a commercial power source supplying alternating current (AC) power. In an exemplary embodiment, the power source 130 may output AC power of 220V-60 Hz. The light source 120 may include one or more LED arrays. In an exemplary embodiment, the light source 120 may include a plurality of LED arrays, and each of the plurality of LED arrays may include one or more LEDs.

The LED driving apparatus 110 may include a power supply circuit 111, a controller IC 112, and a current control circuit 113. The power supply circuit 111 may include a rectifying circuit full-wave rectifying AC power output from the power source 130 and a compensation circuit compensating for an output from the rectifying circuit in a partial time section (e.g., half-wave). The compensation circuit may be a type of passive power factor correction (PFC) circuit. In an exemplary embodiment, the rectifying circuit may include a diode bridge circuit, and the compensation circuit may include a valley-fill circuit.

The controller IC 112 controls the LED arrays included in the light source 120 to be operated by driving power output from the power supply circuit 111, and may be realized as an integrated circuit (IC). The controller IC 112 may include a plurality of internal switches, and each of the plurality of internal switches may be connected to an output terminal of the plurality of LED arrays included in the light source 120.

The current control circuit 113, a circuit provided separately from the controller IC 112, may include at least one switching element and a circuit element such as a resistor, or the like. While the current control circuit 113 is being operated, current flowing in the LED arrays included in the light source 120 may be distributed to the controller IC 112 and the current control circuit 113, and current stress applied to the controller IC 112 may be reduced. In some embodiments, circuit damage due to current stress may be prevented, and heat generated by the LED driving apparatus 110 may be reduced.

Figure 2:
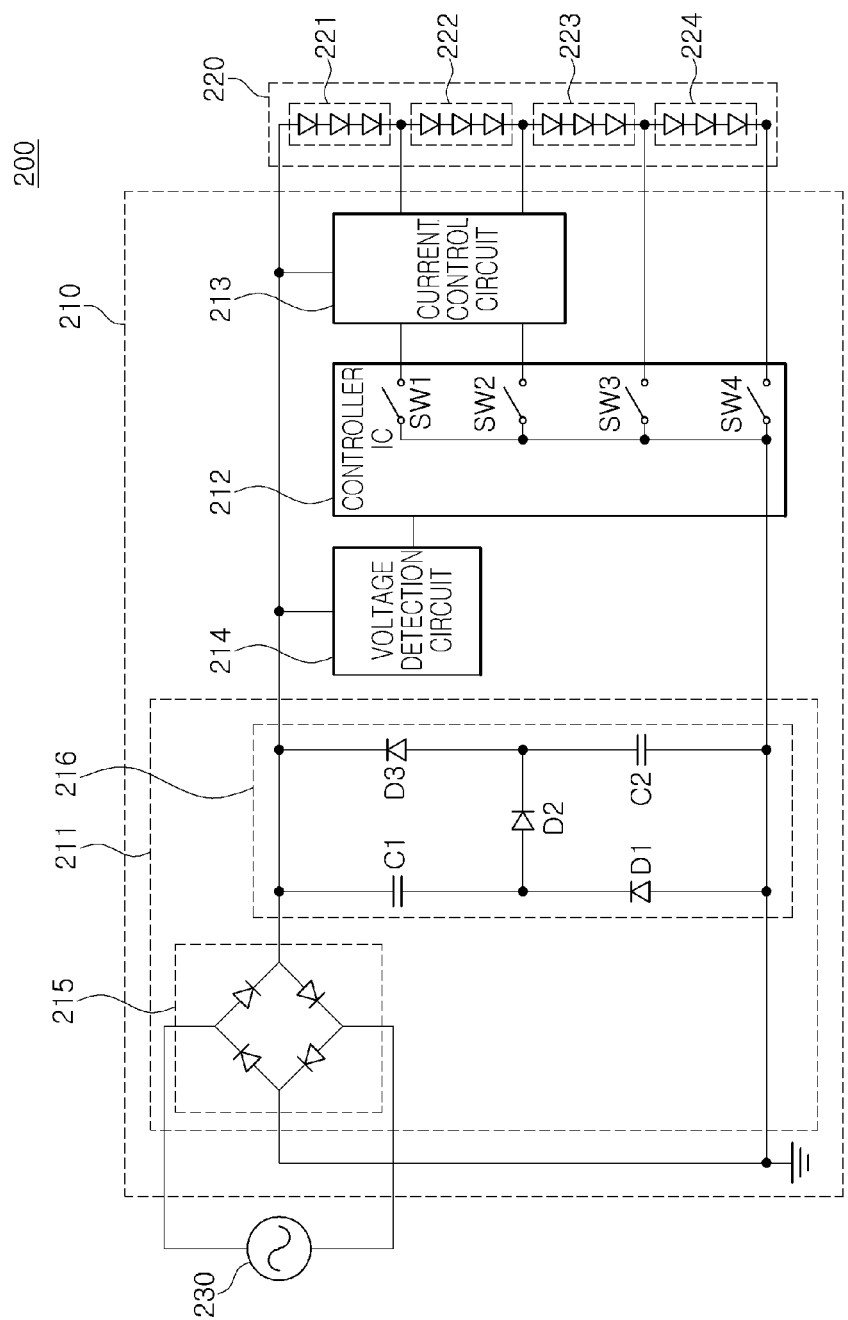
FIGS. 2 through 4 are circuit diagrams illustrating an LED driving apparatus according to certain exemplary embodiments.
Figure 3:
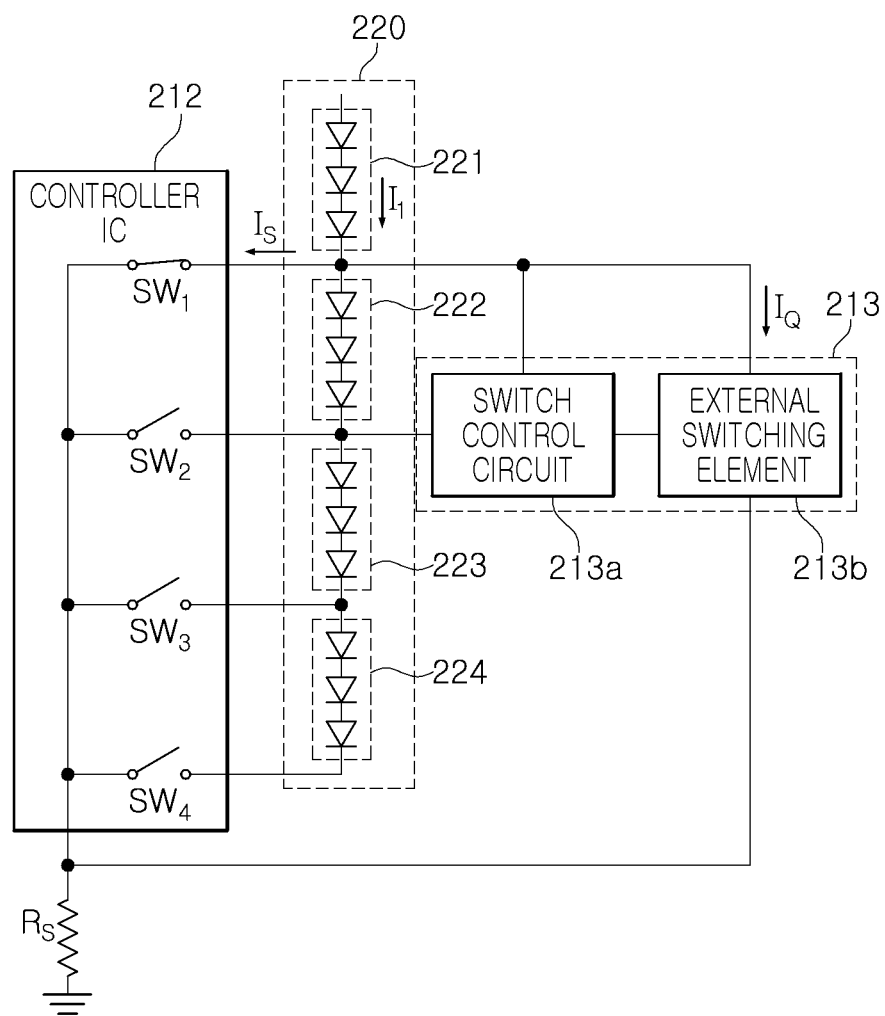
Figure 4:
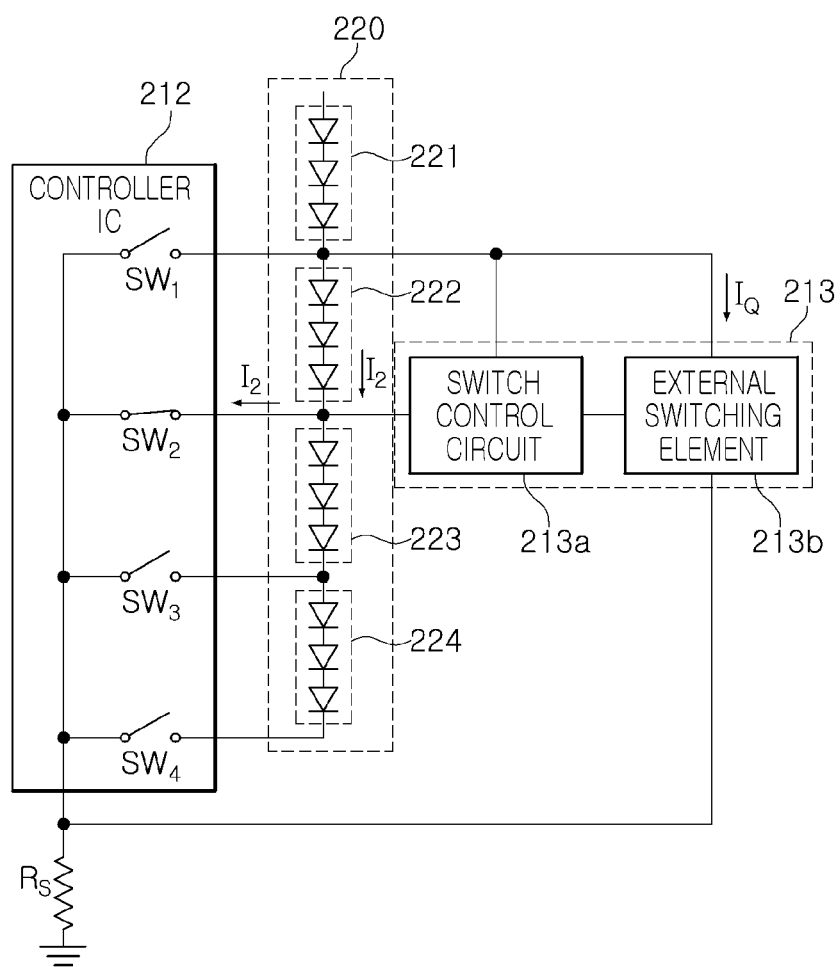

FIGS. 2 through 4 are circuit diagrams illustrating an LED driving apparatus according to an exemplary embodiment.

Referring to circuit diagram 200 of FIG. 2, an LED driving apparatus 210 according to an exemplary embodiment may include a power supply circuit 211, a controller IC 212, a current control circuit 213, and a voltage detection circuit 214. The power supply circuit 211 may include a rectifying circuit 215 and a compensation circuit 216, and each of the rectifying circuit 215 and the compensation circuit 216 may include a diode bridge circuit and a valley-fill circuit.

A power source 230 and a light source 220 may be connected to an input terminal and an output terminal of the LED driving apparatus 210, respectively, and the light source 220 may include a plurality of LED arrays 221, 222, 223, and 224. In the exemplary embodiment illustrated in FIG. 2, the plurality of LED arrays 221 to 224 are connected in series within the light source 220, but, alternatively, at least some of the plurality of LED arrays 221 to 224 may be connected in parallel.

As discussed above, the power supply circuit 211 may perform full-wave rectification of AC power output from the power source 230 to generate driving power (e.g., DC power) for operating the plurality of LED arrays 221 to 224. A voltage of driving power output by the power supply circuit 211 may have a waveform repeatedly increased and decreased during one period, and the controller IC 212 may determine whether the plurality of LED arrays 221 to 224 are to emit light by controlling an operation of the plurality of internal switches SW1 to SW4 on the basis of a magnitude of the voltage of the driving power detected by the voltage detection circuit 214.

Here, an output from the rectifying circuit 215 may not have a voltage having a magnitude sufficient for driving the LED arrays 221 to 224 in a partial section. For example, periodically, an output from the rectifying circuit 215 may have a voltage whose magnitude is insufficient to continuously drive the LED arrays 221 to 224. In some embodiments, when all of the LED arrays 221 to 224 do not emit light continuously during the partial section, a flickering phenomenon may occur. In an exemplary embodiment, to prevent the flickering phenomenon, the power supply circuit 211 may include the compensation circuit 216. The compensation circuit 216 may increase output from the rectifying circuit 215 using energy accumulated in the capacitors C1 and C2 when the output from the rectifying circuit 215 is equal to or smaller than a predetermined magnitude. For example, the compensation circuit 216 may increase output from the rectifying circuit 215 during the partial sections when the output from the rectifying circuit 215 is equal to or smaller than a predetermined magnitude. Hereinafter, an operation of the LED driving apparatus 210 illustrated in FIG. 2 will be described in detail with reference to FIG. 5.

Figure 5:
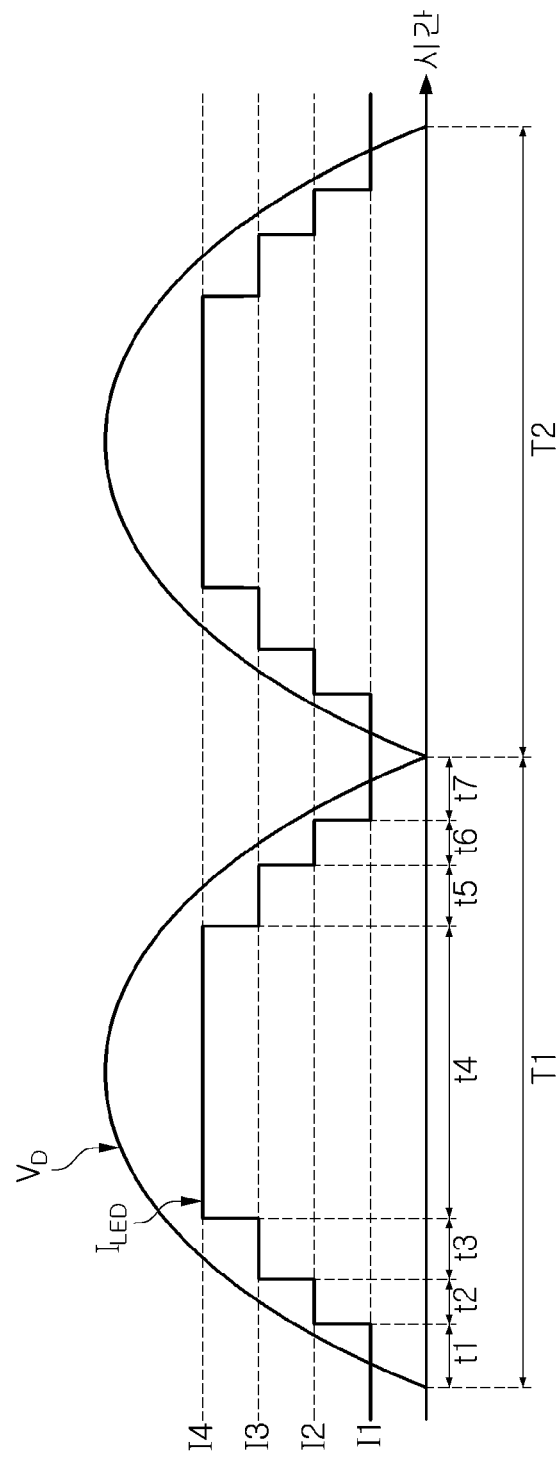
FIG. 5 is a waveform view illustrating the LED driving apparatus, such as that illustrated in exemplary FIGS. 2 through 4.

FIG. 5 is a waveform view illustrating operation of the LED driving apparatus, as discussed in connection with FIGS. 2 through 4.

Referring to FIG. 5, a driving voltage $V_D$ output from the power supply circuit 211 may have a waveform obtained by the full-wave rectification of AC power. In an exemplary embodiment, the driving power $V_D$ may have a waveform repeated at predetermined periods, and in a case in which the power source 230 outputs commercial AC power of 220V-60 Hz, the driving power $V_D$ may have a peak voltage of 220V and a frequency of 120 Hz.

Referring to FIG. 5, which illustrates periods T1 and T2, during first period T1, the driving voltage $V_D$ may be divided into seven durations t1 to t7. In each of the durations t1 to t7, a current $I_{LED}$ having a magnitude of one of I1 to 14 may be supplied to the LED arrays 221 to 224. In general, in a portion of the first duration t1 and the seventh duration t7, the driving power $V_D$ may not be sufficient for generating a current I1 so all the LED arrays 221 to 224 may not be operated. In the present exemplary embodiment, however, the compensation circuit 216 may compensate for the driving voltage $V_D$ when the magnitude of the driving voltage $V_D$ is small. For example, when the compensation circuit 216 compensates the driving voltage $V_D$, the current I1 may be continuously supplied to the LED arrays 221 to 224 during the first and seventh durations t1 and t7, and since a non-emission time is eliminated, a flickering phenomenon may be prevented.

In the first and seventh durations t1 and t7, a voltage of the driving power $V_D$ may have a magnitude sufficient for driving the first LED array 221, but not sufficient for driving both the first LED array 221 and any of the second to fourth LED arrays 222 and 224. Thus, in the first duration t1 and the seventh duration t7, only the first internal switch SW1 among the internal switches SW1 to SW4 of the controller IC 212 is turned on to set a current path allowing the current I1 to flow only through the first LED array 221 and the first internal switch SW1. Thus, in the first duration t1 and the seventh duration t7, only the first LED array 221 operates, and the second to fourth LED arrays 222 to 224 may not operate.

In the second duration t2 and sixth duration t6, a voltage of the driving power $V_D$ may have a magnitude sufficient for driving the first and second LED arrays 221 and 222, but not sufficient for driving both the first and second LED arrays 221 and 222 and any of the third and fourth LED arrays 223 to 224. Thus, the controller IC 212 may turn on only the second internal switch SW2 and turn off the other internal switches SW1, SW3, and SW4 in the second duration t2 and the sixth duration t6. As a result, in the second duration t2 and the sixth duration t6, a path of the current I2 applied to the light source 220 may be defined as a path passing through the first and second LED arrays 221 and 222 and the second internal switch SW2. Thus, in the second duration t2 and the sixth duration t6, the first and second LED arrays 221 and 222 operate, while the third and fourth LED arrays 223 and 224 may not operate.

Similarly, in a third duration t3 and a fifth duration t5, a voltage of the driving power $V_D$ may have a magnitude sufficient for driving the first to third LED arrays 221 to 223, but not sufficient for driving all of the first to fourth LED arrays 221 to 224. In the third duration t3 and the fifth duration t5, the controller IC 212 may turn on only the third internal switch SW3 and turn off the other internal switches SW1, SW2, and SW4 to allow the current I3 to pass through the first to third LED arrays 221 to 223 and the third internal switch SW3. Thus, in the third duration t3 and the fifth duration t5, the first to third LED arrays 221 to 223 may operate, while the fourth LED array 224 may not operate.

In a fourth duration t4, a voltage of the driving power $V_D$ may have a magnitude sufficient for driving all of the first to fourth LED arrays 221 to 224. Thus, during the fourth duration t4, the controller IC 212 may turn off the first to third internal switches SW1 to SW3 and turn on the fourth internal switch SW4 to allow the current I4 to pass through the first to fourth LED arrays 221 to 224 and the fourth internal switch SW4. Thus, in the fourth duration t4, the first to fourth LED arrays 221 to 224 may operate.

As described above with reference to the waveform of FIG. 5, in an exemplary embodiment, operation of the internal switches SW1 to SW4 included in the controller IC 212 varies in each of the durations t1 to t7 of any one period, such as exemplary period T1, and operation of the LED arrays 221 to 224 may be determined accordingly. For example, in an exemplary embodiment, in order to remove a flickering phenomenon by eliminating a non-emission time in which all of the LED arrays 221 to 224 do not emit light, the compensation circuit 216 may supply the current I1 to the LED arrays 221 to 224 during the first duration t1 and the seventh duration t7, respectively corresponding to a start duration and an end duration within one period T1 of the driving power $V_D$. Since the current I1 has a magnitude sufficient for driving the first LED array 221, the first LED array 221 constantly operates during the one period T1 of the driving power $V_D$.

Meanwhile, in order to continuously drive the first LED array 221, the first internal switch SW1 may be turned on in the first duration t1 and the seventh duration t7. Since a turn-on time of the first internal switch SW1 may be lengthened, current stress applied to the first internal switch SW1 and resultant heating may be increased. In order to counter the increased stress and heat, in an exemplary embodiment, the current control circuit 213 may be used. This will hereinafter be described with reference to FIGS. 3 and 4.

First, an operation of the LED driving apparatus 210 during the first duration t1 and the seventh duration t7 will be described with reference to FIG. 3. The current I1 supplied to the light source 220 during the first duration t1 and the seventh duration t7 may have a magnitude sufficient for driving the first LED array 221, but not sufficient for driving the first and second LED arrays 221 and 222 together. In some embodiments, as illustrated in FIG. 3, only the first internal switch SW1 may be turned on, while the other internal switches SW2 to SW4 may be turned off, and thus, only the first LED array 221 may be driven.

As discussed above, in an exemplary embodiment, in order to remove a non-emission time in which none of the LED arrays 221 to 224 operate, the compensation circuit 216 may be included in the power supply circuit 211. Due to the compensation circuit 216, a time in which a current flows in the first internal switch SW1 may be lengthened, which may result in an increase in current stress applied to the controller IC 212 and heating of the circuitry. In some exemplary embodiments, this problem may be solved by disposing the current control circuit 213 outside of the controller IC 212 as illustrated in FIG. 3.

The current control circuit 213 may be connected to an output terminal of the first LED array 221 to adjust the current flowing in the first LED array 211. For example, the current control circuit 213 may be connected to the output terminal of the first LED array 221 to draw a portion of the current I1 flowing in the first LED array 221 during the first duration t1 and the seventh duration t7. Accordingly, the current I1 flowing in the first LED array 221 may be distributed as a current IS flowing to the controller IC 212 and a current IQ flowing to the current control circuit 213, thereby reducing stress and heat generated by the controller IC 212.

The current control circuit 213 may include a switch control circuit 213a and an external switching element 213b. The switch control circuit 213a may determine an operational state of the controller IC 212 by detecting a voltage or a current of the output terminal of the first LED array 221 and the output terminal of the second LED array 222. For example, when a voltage of the output terminal of the first LED array 221 is detected as a value close to a ground voltage, the switch control circuit 213a may determine that the controller IC 212 operates in the first duration t1 and the seventh duration t7.

Also, when a voltage at the output terminal of the first LED array 221 increases, the switch control circuit 213a may determine that the controller IC 212 operates in one or more durations other than the first duration t1 and the seventh duration t7. In the first duration t1 and the seventh duration t7, the switch control circuit 213a may turn on the external switching element 213b to distribute a portion of the current I1 to the IQ. In the duration other than the first duration t1 and the seventh duration t7, the switch control circuit 213a may turn off the external switching element 213b to control the current supplied to the light source 220, allowing the current to entirely flow through the LED array 221 to 224.

FIG. 4 is a circuit diagram illustrating an operational state of the LED driving apparatus 210 during the second duration t2 and the sixth duration t6. Referring to FIG. 4, during the second duration t2 and the sixth duration t6, the controller IC 212 may turn on only the second internal switch SW2 and turn off the other internal switches SW1, SW3, and SW4.

Since the first internal switch SW1 is turned off, a voltage at the output terminal of the first LED array 221 may be increased, compared with that of the first duration t1 and the seventh duration t7. The switch control circuit 213*a* may sense the increase in the voltage at the output terminal of the first LED array 221 and turn off the external switching element 213*b*, and the current I2 supplied to the light source 220 during the second duration t2 and the sixth duration t6 may entirely flow through the second internal switch SW2.

For example, in the exemplary embodiment described with reference to FIGS. 3 and 4, the current control circuit 213 may operate during the first duration t1 and the seventh duration t7, and may not operate during the other durations t2 to t6. However, this is merely an exemplary embodiment, and in order to reduce a current stress and heat generated by the controller IC 212, the current control circuit 213 may draw a portion of current flowing in the LED arrays 221 to 224 even in one or more durations other than the first duration t1 and the seventh duration t7.

Figure 6:
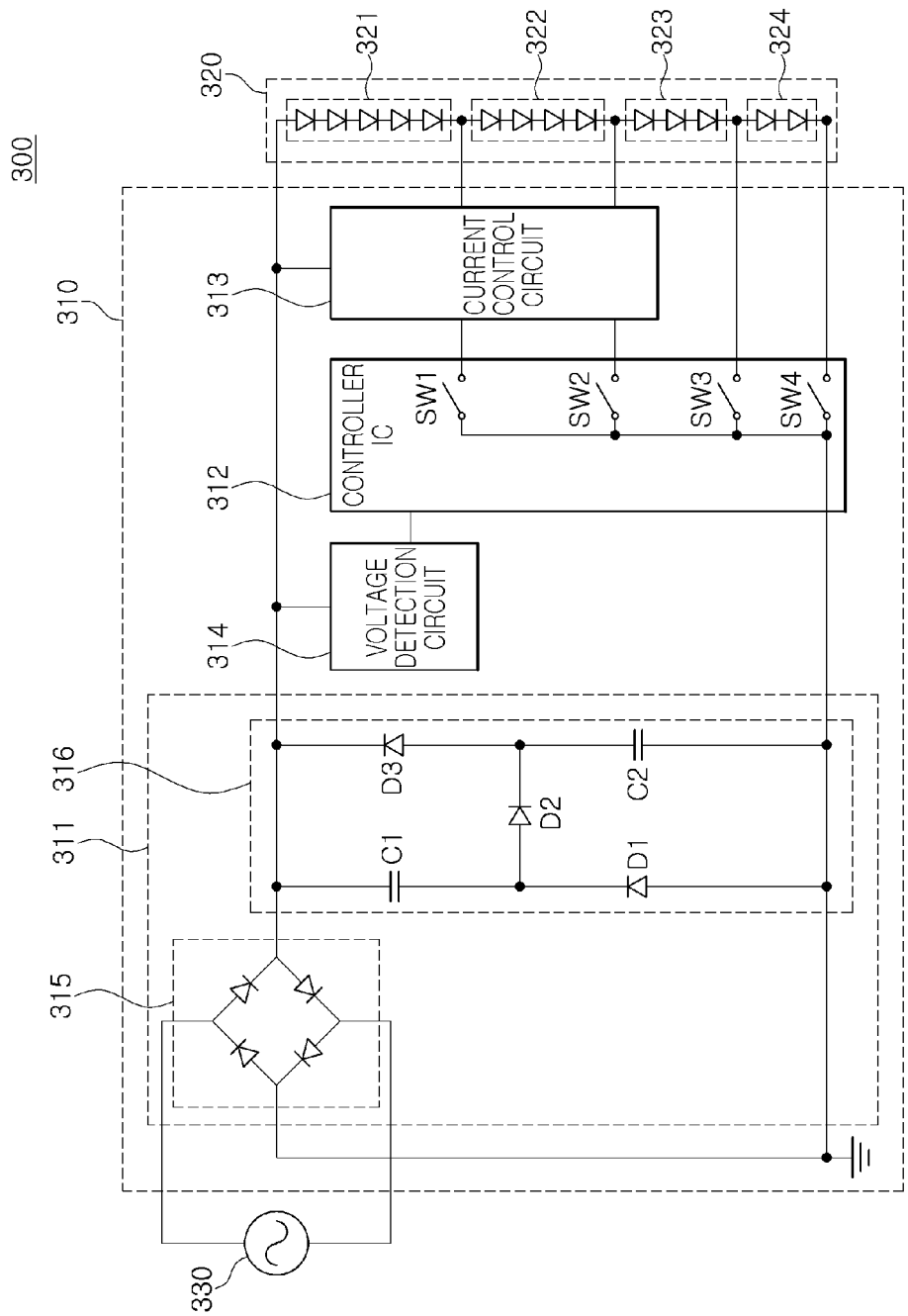
FIG. 6 is a circuit diagram illustrating an LED driving apparatus according to certain exemplary embodiments.

FIG. 6 is a circuit 300 diagram illustrating an LED driving apparatus according to an exemplary embodiment.

Referring to FIG. 6, an LED driving apparatus 310 according to an exemplary embodiment may include a power supply circuit 311, a controller IC 312, a current control circuit 313, and a voltage detection circuit 314. Similar to the circuit diagram illustrated in FIG. 2, the power supply circuit 311 may include a rectifying circuit 315 performing full-wave rectification of AC power output from a power source 330 to generate driving power and a compensation circuit 316 outputting compensation power when a voltage of the driving power is equal to or lower than a predetermined reference voltage. The controller IC 312 may control an operation of LED arrays 321 to 324 included in a light source 320 by determining whether to turn on or off internal switches SW1 to SW4 on the basis of a magnitude of the voltage of the driving power detected by the voltage detection circuit 314. The current control circuit 313 may be connected to any one of the internal switches SW1 to SW4 to distribute current $I_{LED}$ flowing in the LED arrays 321 to 324 to reduce current stress applied to the controller IC 312 and heat generated by the controller IC 312.

The light source 320 connected to the LED driving apparatus 310 illustrated in FIG. 6 may include the LED arrays 321 to 324, each having a different number of LEDs. As illustrated in FIG. 6, the first LED array 321 may have the largest number of LEDs (e.g., 5 LEDs), and the fourth LED array 324 may have a smallest number of LEDs (e.g., 2 LEDs). By determining the number of LEDs included in each of the LED arrays 321 to 324, a power factor of the LED driving apparatus 310 may be increased. Here, the number of LEDs included in each of the LED arrays 321 to 324 may be variously modified. For example, the numbers of LEDs included in each of LED arrays 321 to 324 are illustrative only, and LED arrays 321 to 324 may include a number of LEDs different from that disclosed herein.

Figure 7:
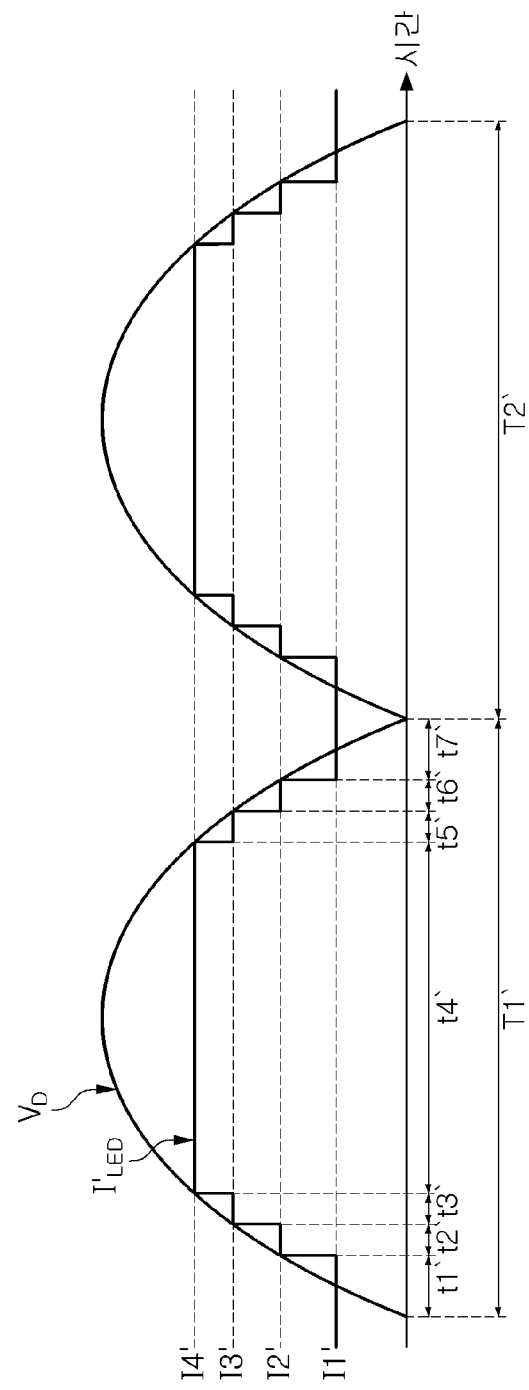
FIG. 7 is a waveform view illustrating the LED driving apparatus, such as that illustrated in exemplary FIG. 6.

FIG. 7 is a waveform view corresponding to the LED driving apparatus illustrated in FIG. 6. Although different, the waveform view illustrated in FIG. 7 may share some similarities to the waveform view illustrated in FIG. 5. For example, in the waveform view illustrated in FIG. 7, one period of driving power $V_D$ may be divided into a total of seven durations t1' to t7' within a single period T1' of two example illustrated periods T1' and T2', similar to those of the waveform view illustrated in FIG. 5.

Since the first LED array 321 includes the largest number of LEDs, a current I1' output from the LED driving apparatus 310 as the first internal switch SW1 is turned on during the first and seventh durations t1' and t7' may be greater than the current I1 according to the waveform view illustrated in FIG. 5. In some embodiments, a difference between the voltage $V_D$ and a current $I'_{LED}$ may be reduced, resulting in an improvement of a power factor.

An operation of the current control circuit 313 may be similar to that described above with reference to FIGS. 2 through 4. The current control circuit 313 may draw a portion of current I1' flowing in the first LED array 321 during the first and seventh durations t1' and t7' in which the first internal switch SW1 is turned on and only the first LED array 321 operates. In some embodiments, a current flowing in the first internal switch SW1 of the controller IC 312 may reduce heat generated by the controller IC 312.

FIGS. 8 through 13 are views illustrating a light emitting device applicable to a lighting device according to an exemplary embodiment.

Figure 8:
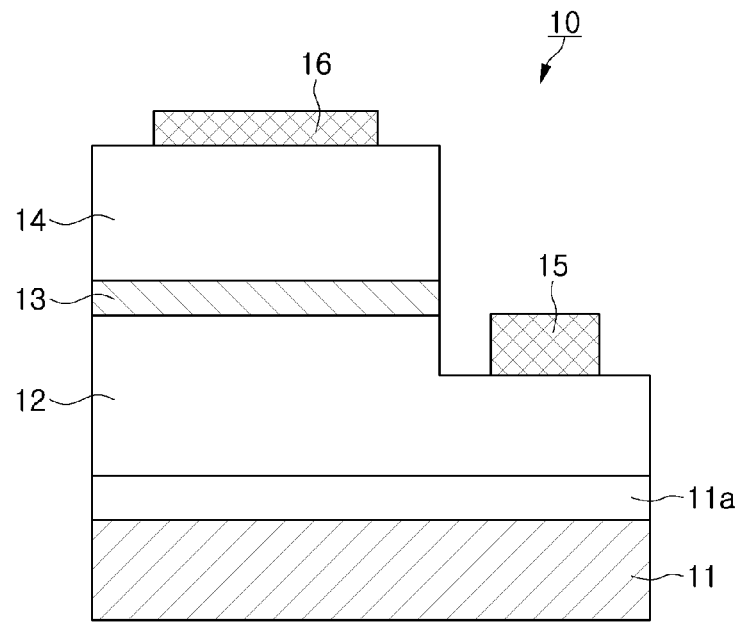
FIGS. 8 through 13 are views illustrating a semiconductor light emitting device applicable to a lighting device according to certain exemplary embodiments.

First, referring to FIG. 8, a light emitting device 10 according to an exemplary embodiment may include a substrate 11, a first conductivity-type semiconductor layer 12, an active layer 13, and a second conductivity-type semiconductor layer 14. A first electrode 15 may be formed on the first conductivity-type semiconductor layer 12, and a second electrode 16 may be formed on the second conductivity-type semiconductor layer 14. In some embodiments, although not shown, an ohmic contact layer may be selectively provided between the second electrode 16 and the second conductive type semiconductor layer 14.

The substrate 11 may be at least one selected from among an insulating substrate, a conductive substrate, and semiconductor substrates according to various exemplary embodiments. The substrate 11 may be formed of, for example, sapphire, SiC, Si, $MgAl_2O_4$, MgO, $LiAlO_2$, $LiGaO_2$, or GaN. For an epitaxial growth of a GaN material, a GaN substrate, a homogeneous substrate, may be selected as a substrate 11, and as a heterogeneous substrate, a sapphire substrate or a silicon carbide (SiC) substrate may be commonly used. When a heterogeneous substrate is used, a defect such as dislocation or the like, may be increased due to a difference in lattice constant between a substrate material and a thin film material, and bowing (or bending) may occur when a temperature is changed due to a difference in a coefficient of thermal expansion between the substrate material and the thin film material, which may cause cracks of the thin film. In order to solve this problem, in some embodiments, a buffer layer 11*a* may be disposed between the substrate 11 and a GaN-based first conductivity-type semiconductor layer 12.

For example, when the first conductivity-type semiconductor layer 12 including GaN is grown on a heterogeneous substrate, a dislocation density may increase due to a mismatch in lattice constant between the substrate material and the thin film material, and cracks and bowing may occur due to a difference in a coefficient of thermal expansion therebetween. In order to prevent such dislocation and cracks, the buffer layer 11*a* may be disposed between the substrate 11 and the first conductivity-type semiconductor layer 12. The buffer layer 11*a* may adjust a degree of bowing of the substrate when the active layer 13 is grown, to reduce a wavelength dispersion of a wafer.

The buffer layer 11*a* may be formed, for example, of $Al_xIn_yGa_{1-x-y}N$, where $0 \leq x \leq 1$ and $0 \leq y \leq 1$, and, in particular, GaN, AlN, AlGaN, InGaN, or InGaNAlN may be used, and in some embodiments, a material such as $ZrB_2$, $HfB_2$, ZrN, HfN, or TiN may also be used. Also, the buffer layer 11*a* may be formed by combining a plurality of layers or by gradually changing a composition.

The silicon substrate may have a significant difference in a coefficient of thermal expansion from GaN. For instance, in a case in which a GaN-based thin film is grown on the silicon substrate, when the GaN thin film is grown and subsequently cooled to room temperature, tensile stress is applied to the GaN thin film due to a difference in a coefficient of thermal expansion between the silicon substrate and the GaN thin film, resulting in the generation of cracks. In order to prevent the generation of cracks, tensile stress may be compensated for using a method of growing a thin film in such a manner that compressive stress is applied to the thin film. Also, silicon (Si) has a high possibility of generating a defect due to a difference in lattice constant from GaN. In the case of using the silicon substrate, stress for restraining bowing also needs to be controlled, as well as defect control, and thus, a buffer layer 11a having a composite structure may be used.

In order to form the buffer layer 11a, first, an AlN layer may be formed on the substrate 11. In exemplary embodiments, a material not including gallium (Ga) may be used in order to prevent a reaction between silicon (Si) and gallium (Ga). The AlN layer is grown at a temperature ranging from 400° C. to 1,300° C. by using an aluminum (Al) source and a nitrogen (N) source. Here, an AlGaN intermediate layer may be inserted into the center of GaN between the plurality of AlN layers to control stress, as necessary, and to form the buffer layer 11a having a composite structure.

In order to prevent a reaction between silicon (Si) and gallium (Ga), a material not including gallium may be used, and a material such as SiC or the like, as well as AlN, may also be used. The AlN layer may be grown at a temperature ranging from 400° C. to 1300° C. using an Al source and an N source, and if necessary, an AlGaN intermediate layer may be inserted in the middle of GaN between a plurality of AlN layers in order to control stress.

The first and second conductivity-type semiconductor layers 12 and 14 may be formed of semiconductors respectively doped with n-type and p-type impurities. However, the present disclosure is not limited thereto, and the first and second conductivity-type semiconductor layers 12 and 14 may be formed of p-type and n-type semiconductors layers, respectively. For example, the first and second conductivity-type semiconductor layers 12 and 14 may be formed of a Group III nitride semiconductor such as, for example, a material having a composition of $Al_xIn_yGa_{1-x-y}N$, where $0 \le x \le 1$, $0 \le y \le 1$, and $0 \le x+y \le 1$. However, the material of the first and second conductivity-type semiconductor layers 12 and 14 is not limited thereto, and a material such as an AlGaInP-based semiconductor or an AlGaAs-based semiconductor may also be used.

The first and second conductivity-type semiconductor layers 12 and 14 each may have a single layer structure, or, alternatively, the first and second conductivity-type semiconductor layers 12 and 14 each may have a multilayer structure including layers having different compositions and thicknesses, as necessary. For example, the first and second conductivity-type semiconductor layers 12 and 14 may have a carrier injection layer for improving electron and hole injection efficiency, or may have various types of superlattice structures, respectively.

The first conductivity-type semiconductor layer 12 may further include a current spreading layer in a region of the first conductivity-type semiconductor layer 12 that is adjacent to the active layer 13. The current spreading layer may have a structure in which a plurality of $In_xAl_yGa_{(1-x-y)}N$ layers having different compositions or different impurity contents are iteratively stacked, or may have an insulating material layer partially formed therein.

The second conductivity-type semiconductor layer 14 may further include an electron blocking layer in a region of the second conductivity-type semiconductor layer 14 that is adjacent to the active layer 13. The electron blocking layer may have a structure in which a plurality of $In_xAl_yGa_{(1-x-y)}N$ layers having different compositions are stacked, or may have one or more layers including $Al_yGa_{(1-y)}N$. The electron blocking layer has a band gap wider than that of the active layer 13, thus preventing electrons from being transferred to the second conductivity-type semiconductor layer 14. For example, the electron blocking layer may have a band gap that prevents electrons from being transferred through the second conductivity-type semiconductor layer 14.

The first and second conductivity-type semiconductor layers 12 and 14 and the active layer 13 may be formed, for example, by using metal-organic chemical vapor deposition (MOCVD). In order to form the first and second conductivity-type semiconductor layers 12 and 14 and the active layer 13, an organic metal compound gas (e.g., trimethyl gallium (TMG), trimethyl aluminum (TMA), etc.) and a nitrogen-containing gas (e.g., ammonia ($NH_3$), etc.) are supplied as reaction gases to a reaction container in which the growth substrate 11 is installed. The substrate 11 is maintained at a high temperature ranging from 900° C. to 1,100° C. While a gallium nitride-based compound semiconductor is being grown, an impurity gas may be supplied as necessary to stack the gallium nitride-based compound semiconductor as an undoped n-type or p-type semiconductor. Silicon (Si) is a well-known n-type impurity. P-type impurities include zinc (Zn), cadmium (Cd), beryllium (Be), magnesium (Mg), calcium (Ca), and barium (Ba), and among them, magnesium (Mg) and zinc (Zn) are commonly used.

Also, the active layer 13 disposed between the first and second conductivity-type semiconductor layers 12 and 14 may have a multi-quantum well (MQW) structure in which quantum well layers and quantum barrier layers are alternately stacked. For example, in the case of a nitride semiconductor, a GaN/InGaN structure may be used, or a single quantum well (SQW) structure may also be used. The first or second electrodes 15 or 16 may be formed of a material such as silver (Ag), nickel (Ni), aluminum (Al), rhodium (Rh), palladium (Pd), iridium (Ir), ruthenium (Ru), magnesium (Mg), zinc (Zn), platinum (Pt), or gold (Au). The light emitting device 10 illustrated in FIG. 8 may have an epi-up structure, and thus, the light emitting device 10 may be connected to a circuit pattern included in a circuit board through a wire, or the like, within a light emitting device package.

Figure 9:
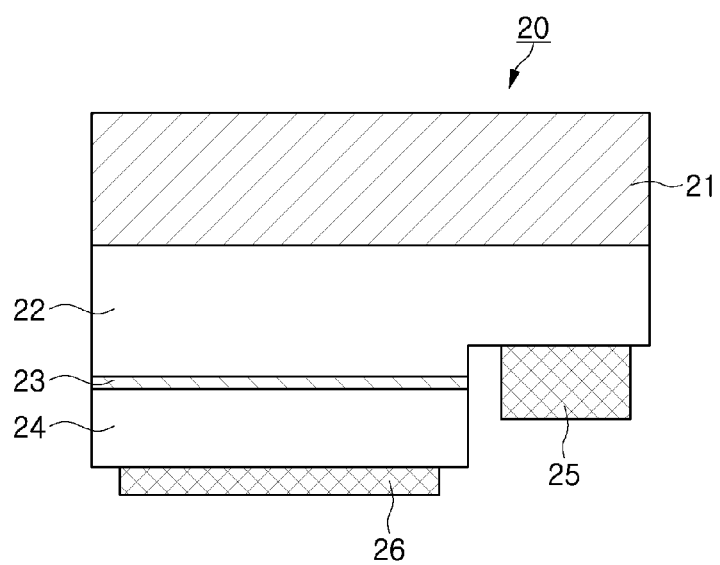

Referring to FIG. 9, a light emitting device 20 according to an exemplary embodiment may include a support substrate 21, first and second conductivity-type semiconductor layers 22 and 24, an active layer 23, and first and second electrodes 25 and 26. The light emitting device 20 according to the exemplary embodiment illustrated in FIG. 9 may be attached to a circuit board of a light emitting device package through flip-chip bonding. Since light generated by the active layer 23 needs to be emitted upwardly, the support substrate 21 may be formed of a material that is translucent.

Also, in order to reflect light generated by the active layer 23 and moving downwardly, the second electrode 26 may be formed of a material having electric conductivity and reflectivity. For example, the second electrode 26 may be formed of a material that is highly conductive and reflective to cause light generated by the active layer 23 to be reflected back toward the support substrate 21. In an exemplary embodiment, the second electrode 26 may be formed of at least one of silver (Ag), nickel (Ni), aluminum (Al), rhodium (Rh), palladium (Pd), iridium (Ir), ruthenium (Ru), magnesium (Mg), zinc (Zn), platinum (Pt), and gold (Au).

Figure 10:
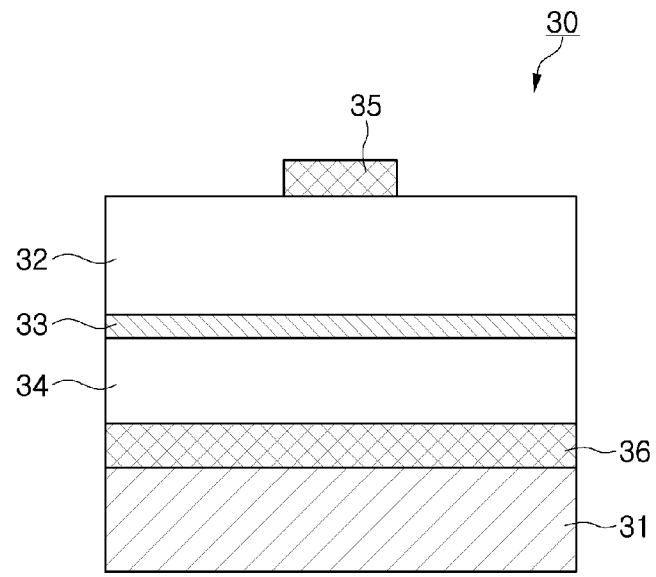

Referring to FIG. 10, a light emitting device 30 according to an exemplary embodiment is illustrated. The light emitting device 30 according to an exemplary embodiment may include a first conductivity-type semiconductor layer 32, an active layer 33, a second conductivity-type semiconductor layer 34, a first electrode 35 attached to the first conductivity-type semiconductor layer 32, and a second electrode 36 attached to the second conductivity-type semiconductor layer 34. A conductive substrate 31 may be disposed on a lower surface of the second electrode 36, and the conductive substrate 31 may be directly mounted on a circuit board for constituting a light emitting device package. Within a light emitting device package, for example, the conductive substrate 31 may be directly mounted on a circuit board (not shown), and the first electrode 35 may be electrically connected to a circuit pattern (not shown) of the circuit board through a wire or the like.

As with the exemplary semiconductor light emitting devices 10 and 20 described above, the first conductivity-type semiconductor layer 32 and the second conductivity-type semiconductor layer 34 may include an n-type nitride semiconductor and a p-type nitride semiconductor, respectively. The active layer 33 disposed between the first and second conductivity-type semiconductor layers 32 and 34 may have an MQW structure in which nitride semiconductor layers having different compositions are alternately stacked. In some embodiments, the active layer 33 may also selectively have an SQW structure.

The first electrode 35 may be disposed on an upper surface of the first conductivity-type semiconductor layer 32, and the second electrode 36 may be disposed on a lower surface of the second conductivity-type semiconductor layer 34. Light generated by the active layer 33 of the light emitting device 30 illustrated in FIG. 10 according to electron-hole recombination may be emitted to an upper surface of the first conductivity-type semiconductor layer 32. For instance, in order to reflect light generated by the active layer 33 in the direction of the upper surface of the first conductivity-type semiconductor layer 32, the second electrode 36 may be formed of a material having high reflectivity. The second electrode 36 may include, for example, at least one of Ag, Al, Ni, Cr, Cu, Au, Pd, Pt, Sn, Ti, W, Rh, Ir, Ru, Mg, Zn, or alloys thereof.

Figure 11:
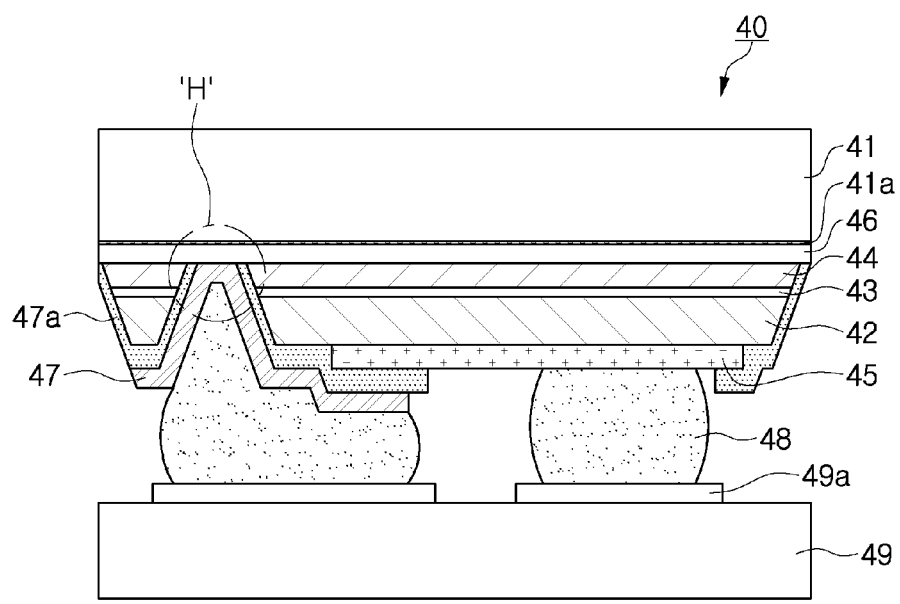

Referring to FIG. 11, a light emitting device 40 according to an exemplary embodiment includes a first conductivity-type semiconductor layer 42, a second conductivity-type semiconductor layer 44, an active layer 43 positioned between the first and second conductivity-type semiconductor layers 42 and 44, and first and second electrodes 45 and 46 respectively connected to the first and second conductivity-type semiconductor layers 42 and 44. In the present exemplary embodiment, the first and second electrodes 45 and 46 may be disposed on surfaces opposing each other with the first and second conductivity-type semiconductor layers 42 and 44 and the active layer 43. A support substrate 41 may be attached to the second electrode 46 by a bonding layer 41a, supporting the light emitting device 40.

The light emitting device 40 according to the present exemplary embodiment may further include a connecting electrode 47 as an electrode element related to the second electrode 46. The connecting electrode 47 may be connected to the second electrode 46 through a through hole H formed by removing at least portions of the first and second conductivity-type semiconductor layers 42 and 44 and the active layer 43. At least a portion of the second electrode 46 may be exposed through the through hole H, and the second electrode 46 and the connecting electrode 47 may be connected in the exposed region. The connecting electrode 47 may be formed along a side wall of the through hole H, and an insulating layer 47a may be provided between the connecting electrode 47 and the side wall of the through hole H in order to prevent the connecting electrode 47 from being electrically connected to the active layer 43 and the first conductivity-type semiconductor layer 42.

The aforementioned electrode structure may be more effectively applied in a configuration in which the first and second conductivity-type semiconductor layers 42 and 44 are n-type and p-type nitride semiconductor layers, respectively. The p-type nitride semiconductor layer may have contact resistance greater than that of the n-type nitride semiconductor layer, and thus, it may be difficult to obtain ohmic contact. However, in the exemplary embodiment illustrated in FIG. 11, since the second electrode 46 is disposed on the entire surface of the support substrate 41, a contact area between the second conductivity-type semiconductor layer 44 and the second electrode 46 may be sufficiently secured, whereby ohmic contact with the p-type nitride semiconductor layer may be secured.

The light emitting device 40 according to the exemplary embodiment illustrated in FIG. 11 may have a flip-chip structure in which light is emitted in a direction toward the support substrate 41. For example, the first electrode 45 and the connecting electrode 47 may be electrically connected to a circuit pattern 49a of a circuit board 49 through a solder bump 48 or the like. In some embodiments, the first electrode 45 may include an electrode material having high reflectivity as well as ohmic contact characteristics. The second electrode 46 and the support substrate 41 may have high translucency. For example, the first electrode 45 may include a material such as Ag, Ni, Al, Rh, Pd, Ir, Ru, Mg, Zn, Pt, or Au. The second electrode 46 may be a translucent (or light-transmissive) metal such as Ni and/or Au, a transparent conductive oxide such as indium tin oxide (ITO), or a nitride. The support substrate 41 may be a glass substrate or a substrate formed of a translucent polymer resin.

The connecting electrode 47 may be electrically connected to the first conductivity-type semiconductor layer 42 and the active layer 43 through the insulating layer 47a. As illustrated in FIG. 11, the insulating layer 47a may be formed along a side wall of the through hole H. Also, the insulating layer 47a may be formed on side surfaces of the first and second conductivity-type semiconductor layers 42 and 44 and the active layer 43, and may be provided as a passivation layer for the light emitting device 10. The insulating layer 47a may include a silicon oxide or a silicon nitride.

Figure 12:
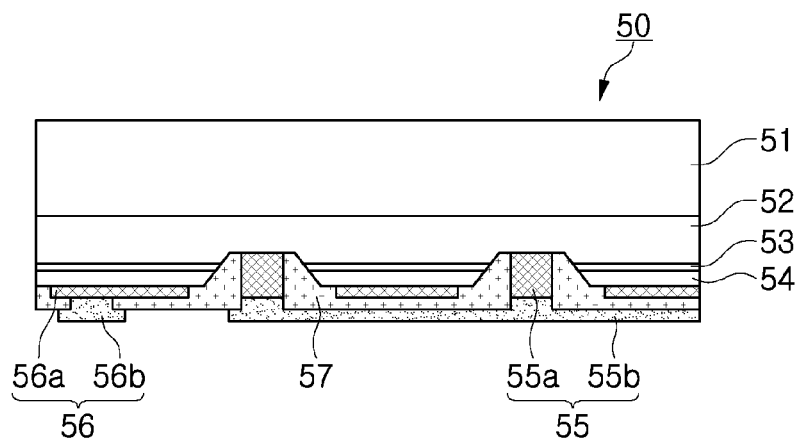

Referring to FIG. 12, a light emitting device 50 according to an exemplary embodiment is disclosed. The light emitting device 50 may include a first conductivity-type semiconductor layer 52, an active layer 53, a second conductivity-type semiconductor layer 54, and first and second electrodes 55 and 56 sequentially stacked on one surface of a substrate 51. For example, the first and second electrodes 55 and 56 may be formed in a vertical series on one surface of the substrate 51. Also, the light emitting device 50 may include an insulating part 57. The first and second electrodes 55 and 56 may include contact electrodes 55a and 56a and connecting electrodes 55b and 56b, and partial regions of the contact electrodes 55a and 56a exposed by the insulating part 57 may be connected to the connecting electrodes 55b and 56b.

The first contact electrode 55a may be provided as a conductive via connected to the first conductivity-type semiconductor layer 52 through the second conductivity-type semiconductor layer 54 and the active layer 53. The second contact electrode 56a may be connected to the second conductivity-type semiconductor layer 54. A plurality of conductive vias may be formed in a single light emitting device region.

The first and second contact electrodes 55a and 56a may be formed by depositing a conductive ohmic material on the first and second conductivity-type semiconductor layers 52 and 54. The first and second contact electrodes 55a and 56a may include at least one of Ag, Al, Ni, Cr, Cu, Au, Pd, Pt, Sn, Ti, W, Rh, Ir, Ru, Mg, Zn, and alloys thereof. Also, the second contact electrode 56a may serve to reflect light generated by the active layer 53 and emitted downwardly from the light emitting device 50.

The insulating part 57 may have an open region exposing at least portions of the first and second contact electrodes 55a and 56a, and the first and second connecting electrodes 55b and 56b may be respectively connected to the first and second contact electrodes 55a and 56a. The insulating part 57 may be deposited to have a thickness of 0.01 µm to 3 µm at a temperature of 500° C. or lower through a $SiO_2$ and/or SiN chemical vapor deposition (CVD) process. The first and second electrodes 55 and 56 may be mounted in a flip-chip form on the light emitting device package.

The first and second electrodes 55 and 56 may be electrically separated from each other by the insulating part 57. Any material may be used as a material of the insulating part 57 as long as it has electrically insulating properties. In some embodiments, for example, a material having a low light absorption rate is used in order to prevent a degradation of light extraction efficiency. For example, a silicon oxide or a silicon nitride such as $SiO_2$, $SiO_xN_y$, or $Si_xN_y$ may be used. In some embodiments, alight-reflective filler may be dispersed in a light-transmissive material to form a light reflective structure.

The substrate 51 may have first and second surfaces opposing each other, and an irregular pattern may be formed on at least one of the first and second surfaces. The irregular pattern formed on one surface of the substrate 51 may be formed by etching a portion of the substrate 51 so that it may be formed of the same material as that of the substrate 51, or may be formed of a material different from that of the substrate 51. For example, when the irregular pattern is formed on an interface between the substrate and the first conductivity-type semiconductor layer 52, paths of light emitted from the active layer 53 may be varied, and thus, a percentage of light absorbed in the interior of the semiconductor layers may be reduced, and a percentage of light scattering may be increased, increasing light extraction efficiency. Also, in some embodiments, a buffer layer (not shown) may be provided between the substrate 51 and the first conductivity-type semiconductor layer 52.

Figure 13:
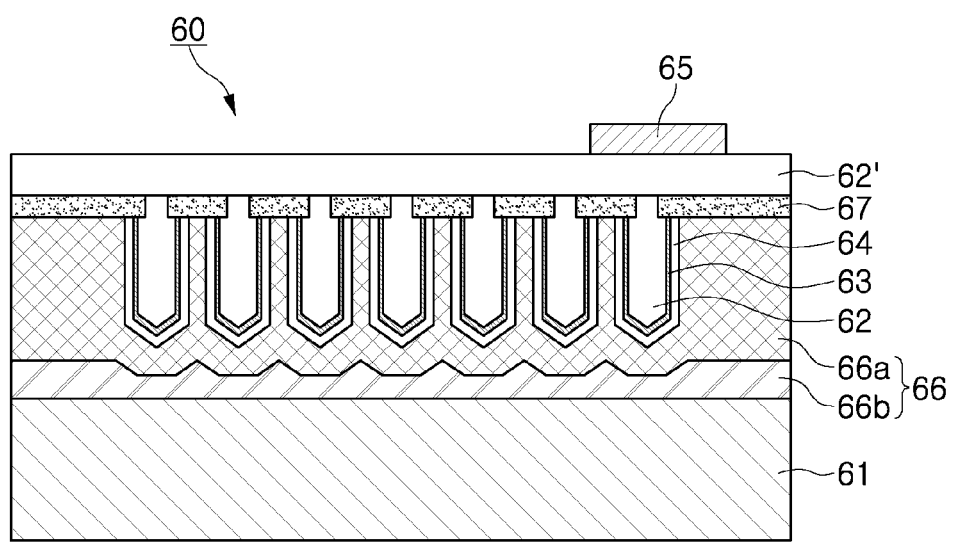

Referring to FIG. 13, a light emitting device 60 according to an exemplary embodiment may be a light emitting device having light emitting nanostructures. The light emitting device 60 may include abase layer 62' including a first conductivity-type semiconductor material, a mask layer 67 prepared on the base layer 62' and providing a plurality of openings, and nanocores 62 formed in openings provided by the mask layer 67. An active layer 63 and a second conductivity-type semiconductor layer 64 may be provided on the nanocore 62. The nanocore 62, the active layer 63, and the second conductivity-type semiconductor layer 64 may provide a light emitting nanostructure.

A second contact electrode 66a may be provided on the second conductivity-type semiconductor layer 64, and a second connecting electrode 66b may be provided on one surface of the second contact electrode 66a. The second contact electrode 66a and the second connecting electrode 66b may be provided as a second electrode 66. A support substrate 61 may be attached to one surface of the second electrode 66, and the support substrate 61 may be a conductive or insulating substrate. In some embodiments, when the support substrate 61 has conductivity, the support substrate 61 may be directly mounted on a circuit board of a light emitting device package. A first electrode 65 may be provided on the base layer 62' and may include a first conductivity-type semiconductor material. The first electrode 65 may be connected to a circuit pattern (not illustrated) included in a circuit board of a light emitting device package by a wire or the like.

Figure 14A:
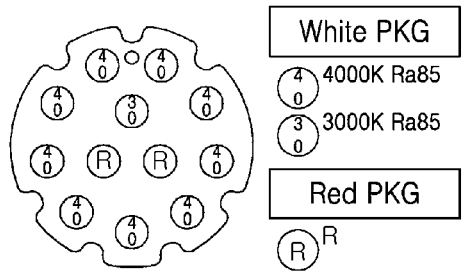
FIGS. 14A and 14B are views schematically illustrating a white light source module applicable to a lighting device according to certain exemplary embodiments.
Figure 14B:
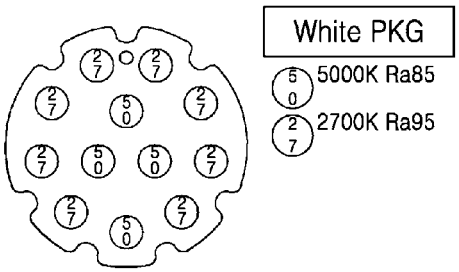
Figure 15:
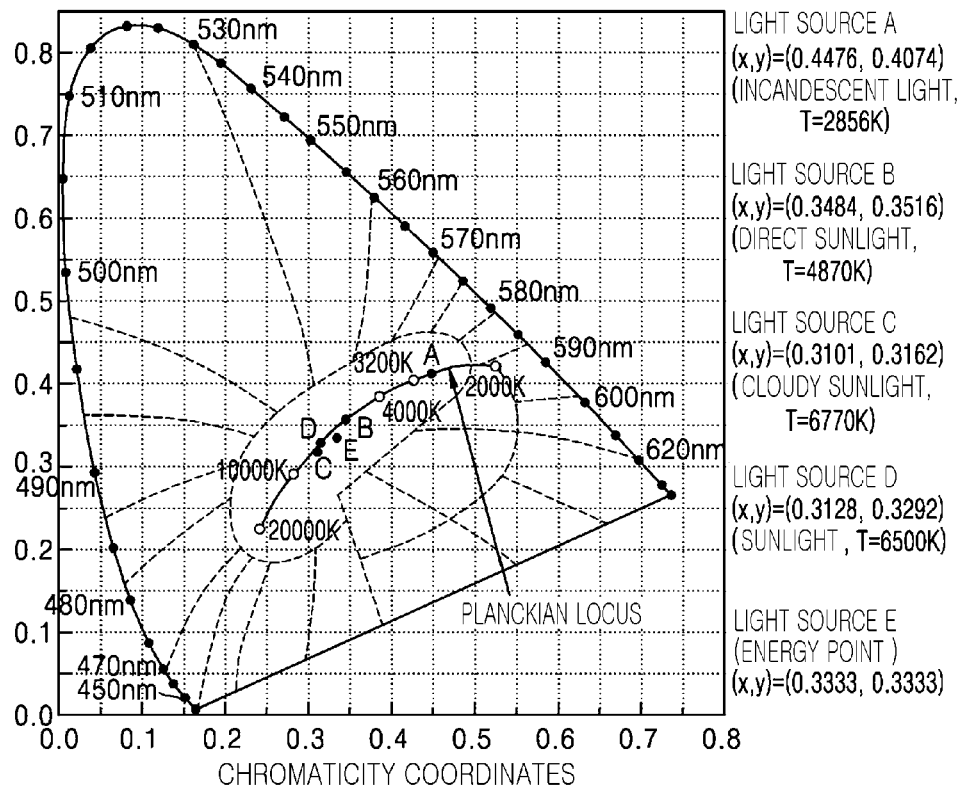
FIG. 15 is a CIE 1931 color space chromaticity diagram illustrating an operation of a white light source module, such as that illustrated in exemplary FIGS. 14A and 14B.

FIGS. 14A and 14B are views schematically illustrating an exemplary white light source module applicable to a lighting device according to an exemplary embodiment. FIG. 15 is a CIE 1931 color space chromaticity diagram illustrating an operation of a white light source module illustrated in exemplary FIGS. 14A and 14B.

The white light source modules respectively illustrated in FIGS. 14A and 14B may include a plurality of light emitting device packages mounted on a circuit board. A plurality of light emitting device packages mounted on a single light source module may be configured as homogenous packages generating light having the same wavelength, or as in the present exemplary embodiment, a plurality of light emitting device packages mounted on a single light source module may be configured as heterogeneous packages generating light having different wavelengths.

Referring to FIG. 14A, a white light source module may include a combination of white light emitting device packages 40 and 30 respectively having color temperatures of 4,000K and 3,000K and red light emitting device packages (indicated as R in FIG. 14A). The white light source module may provide white light having a color temperature that may be adjusted to range from 3,000K to 4,000K and having a color rendering index (CRI) or International Commission on Illumination (CIE) Ra ranging from 95 to 100. In the example of FIG. 14A, the white light may have a color temperature of Ra85.

In another exemplary embodiment, a white light source module may include only white light emitting device packages 27 and 50, and some of the packages may have white light having a different color temperature. For example, as illustrated in FIG. 14B, by combining white light emitting device packages 27 having a color temperature of 2,700K and white light emitting device packages 50 having a color temperature of 5,000K, white light having a color temperature that may be adjusted to range from 2,700K to 5,000K and having a CRI Ra ranging from 85 to 99 may be provided. Here, the amount of light emitting device packages of each color temperature may vary depending on a basic set color temperature value. For example, in a case of a lighting device in which a basic set value is a color temperature of about 4,000K, the number of packages corresponding to the color temperature of 4,000K may be adjusted to be greater than the number of packages corresponding to a color temperature of 3,000K or the number of red light emitting device packages.

In this manner, the heterogeneous light emitting device packages are configured to include at least one of a light emitting device emitting white light by combining yellow, green, red, or orange phosphor to a blue light emitting device and a violet, blue, green, red, or infrared light emitting device, whereby a color temperature and CRI of white light may be adjusted. The aforementioned white light source module may be employed as a light source in various types of lighting devices.

In a single light emitting device package, light having a desired color is determined according to wavelengths of an LED chip as a light emitting device, and types and mixing ratios of phosphors, and in a case of white light, a color temperature and a CRI that may be adjusted.

For example, in a case in which an LED chip emits blue light, a light emitting device package including at least one of yellow, green, and red phosphors may emit white light having various color temperatures according to mixing ratios of phosphors. In contrast, a light emitting device package in which a green or red phosphor is applied to a blue LED chip may emit green or red light. In this manner, a color temperature or a CRI of white light may be adjusted by combining a light emitting device package emitting white light and a light emitting device package emitting green or red light. Also, at least one of light emitting devices emitting violet, blue, green, red, or infrared light may be included.

In this case, the lighting device may control a color rendering index (CRI) to range from the level of light emitted by a sodium lamp to the level of sunlight, and control a color temperature ranging from 1,500K to 20,000K to generate various levels of white light. For example, the lighting device may generate visible light having violet, blue, green, red, orange colors, or infrared light to adjust an illumination color according to a surrounding atmosphere or mood. As another example, the lighting device may generate light having a special wavelength stimulating plant growth.

White light generated by combining yellow, green, and red phosphors and/or green and red light emitting devices to a blue LED may have two or more peak wavelengths, and, as illustrated in FIG. 15, (x,y) coordinates may be positioned in a segment linking light source A (0.4476, 0.4074), light Source B (0.3484, 0.3516), light source C (0.3101, 0.3162), light source D (0.3128, 0.3292), and light source E (0.3333, 0.3333) of the CIE 1931 color space chromaticity diagram. Alternatively, the (x,y) coordinates may be positioned in a region surrounded by the segment and a spectrum of black body radiation. A color temperature of white light corresponds to a range from about 1,500K to about 20,000K. For example, light source A may be incandescent light and have a temperature T of 2856K, light source B may be direct sunlight and have a temperature T of 4870K, light source C may be cloudy sunlight and have a temperature T of 6770K, and light source D may be sunlight and have a temperature T of 6500K. In FIG. 15, white light in the vicinity of the point E (0.3333, 0.3333) present in a lower portion of the spectrum of black body radiation is in a state in which light of a yellow component is relatively weak, which may be used as a light source for illumination in a region in which a vivid or fresh feeling for the naked eye is provided. For example, lighting products using white light in the vicinity of the point E (0.3333, 0.3333) in the lower portion of the spectrum of black body radiation, referred to as energy point, may be effectively used as lighting in stores selling groceries or clothes.

Figure 16:
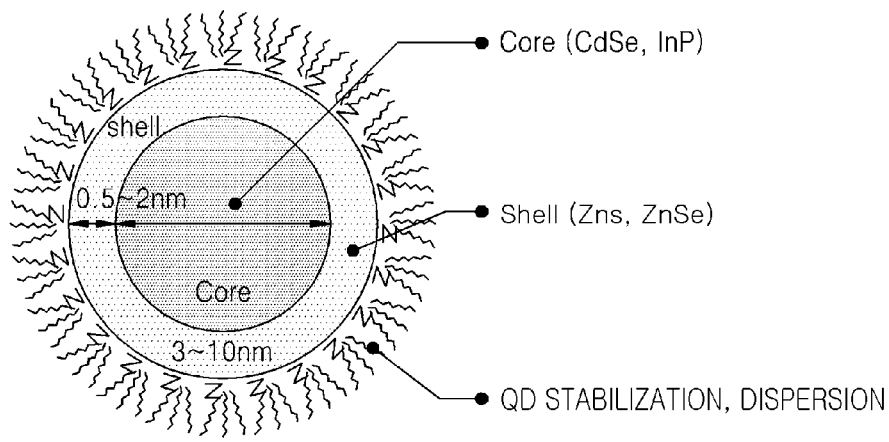
FIG. 16 is a cross-sectional view of a wavelength conversion material that may be applied to a light source of a lighting device according to certain exemplary embodiments.

FIG. 16 is a cross-sectional view of a wavelength conversion material that may be applied to a light source of a lighting device according to an exemplary embodiment.

A wavelength conversion material is a material for converting a wavelength of light emitted from a light emitting device. Various materials, such as phosphors and/or quantum dots, may be used for wavelength conversion.

Phosphors applied to the wavelength conversion material may have the following empirical formulas and colors:

Oxides: Yellow and green $Y_3Al_5O_{12}$:Ce, $Tb_3Al_5O_{12}$:Ce, $Lu_3Al_5O_{12}$:Ce.

Silicates: Yellow and green $(Ba,Sr)_2SiO_4$:Eu, yellow and orange $(Ba,Sr)_3SiO_5$:Ce.

Nitrides: Green β-SiAlON:Eu, yellow $La_3Si_6N_{11}$:Ce, orange α-SiAlON:Eu, red $CaAlSiN_3$:Eu, $Sr_2Si_5N_3$:Eu, $SrSiAl_4N_7$:Eu, $SrLiAl_3N_4$:Eu, and Equation (1), defined as: $Ln_{4-x}(Eu_zM_{1-z})_xSi_{12-y}Al_yO_{3+x+y}N_{18-x-y}$, where $0.5 \leq x \leq 3$, $0 < z < 0.3$, and $0 < y \leq 4$.

In Equation (1), Ln may be at least one type of element selected from the group consisting of Group IIIa elements and rare earth elements, and M may be at least one type of element selected from the group consisting of calcium (Ca), barium (Ba), strontium (Sr), and magnesium (Mg).

Fluorides: KSF-based red $K_2SiF_6$:$Mn_4^+$, $K_2TiF_6$:$Mn_4^+$, $NaYF_4$:$Mn_4^+$, $NaGdF_4$:$Mn_4^+$, $K_3SiF_7$:$Mn^{4+}$ (for example, a composition ratio of Mn may be $0 < z <= 0.17$).

Generally, it is desirable that phosphor compositions conform with stoichiometry, and respective elements may be substituted with different elements of respective groups of the periodic table. For example, strontium (Sr) may be substituted with barium (Ba), calcium (Ca), magnesium (Mg), and the like, of alkali earth elements, and yttrium (Y) may be substituted with terbium (Tb), lutetium (Lu), scandium (Sc), gadolinium (Gd), and the like. Also, europium (Eu), an activator, may be substituted with cerium (Ce), terbium (Tb), praseodymium (Pr), erbium (Er), ytterbium (Yb), and the like, according to a desired energy level, and an activator may be applied alone, or a coactivator or the like may be additionally applied to change characteristics.

In particular, in order to enhance reliability at high temperatures and high humidity, the fluoride-based red phosphor may be coated with a fluoride not containing manganese (Mn) or may further include an organic substance coated on a surface of the fluoride coating not containing manganese (Mn). Unlike other phosphors, the fluoride-based red phosphor may realize a narrow full width at half maximum (FWHM) equal to or less than 40 nm, and in some embodiments, it may be utilized in high resolution televisions (TVs), such as ultra-high definition (UHD) TVs, or other high resolution display devices.

Table 1 below illustrates types of phosphors in application fields of light emitting device packages using a blue LED chip having a dominant wavelength ranging from 440 nm to 460 nm or a ultraviolet (UV) LED chip having a dominant wavelength ranging from 380 nm to 440 nm.

TABLE 1

| Purpose | Phosphor |
| --- | --- |
| LED TV BLU | β-SiAlON:$Eu^{2+}$, (Ca, Sr)AlSiN$_3$:$Eu^{2+}$, La$_3$Si$_6$N$_{11}$:$Ce^{3+}$, K$_2$SiF$_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$ (0.5 ≤ x ≤ 3, 0 < z < 0.3, 0 < y ≤ 4), K$_2$TiF$_6$:$Mn^{4+}$, NaYF$_4$:$Mn^{4+}$, NaGdF$_4$:$Mn^{4+}$, K$_3$SiF$_7$:$Mn^{4+}$ |
| Lighting | Lu$_3$Al$_5$O$_{12}$:$Ce^{3+}$, Ca-α-SiAlON:$Eu^{2+}$, La$_3$Si$_6$N$_{11}$:$Ce^{3+}$, (Ca, Sr)AlSiN$_3$:$Eu^{2+}$, Y$_3$Al$_5$O$_{12}$:$Ce^{3+}$, K$_2$SiF$_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$ (0.5 ≤ x ≤ 3, 0 < z < 0.3, 0 < y ≤ 4), K$_2$TiF$_6$:$Mn^{4+}$, NaYF$_4$:$Mn^{4+}$, NaGdF$_4$:$Mn^{4+}$, K$_3$SiF$_7$:$Mn^{4+}$ |

TABLE 1-continued

| Purpose | Phosphor |
|---|---|
| Side viewing (Mobile devices, Laptop PCs) | $Lu_3Al_5O_{12}:Ce^{3+}$, $Ca\text{-}\alpha\text{-}SiAlON:Eu^{2+}$, $La_3Si_6N_{11}:Ce^{3+}$, $(Ca, Sr)AlSiN_3:Eu^{2+}$, $Y_3Al_5O_{12}:Ce^{3+}$, $(Sr, Ba, Ca, Mg)_2SiO_4:Eu^{2+}$, $K_2SiF_6:Mn^{4+}$, $SrLiAl_3N_4:Eu$, $Ln_{4-x}(Eu_zM_{1-z})_xSi_{12-y}Al_yO_{3+x+y}N_{18-x-y}$ ($0.5 \leq x \leq 3$, $0 < z < 0.3$, $0 < y \leq 4$), $K_2TiF_6:Mn^{4+}$, $NaYF_4:Mn^{4+}$, $NaGdF_4:Mn^{4+}$, $K_3SiF_7:Mn^{4+}$ |
| Electrical components (Headlamps, etc.) | $Lu_3Al_5O_{12}:Ce^{3+}$, $Ca\text{-}\alpha\text{-}SiAlON:Eu^{2+}$, $La_3Si_6N_{11}:Ce^{3+}$, $(Ca, Sr)AlSiN_3:Eu^{2+}$, $Y_3Al_5O_{12}:Ce^{3+}$, $K_2SiF_6:Mn^{4+}$, $SrLiAl_3N_4:Eu$, $Ln_{4-x}(Eu_zM_{1-z})_xSi_{12-y}Al_yO_{3+x+y}N_{18-x-y}$ ($0.5 \leq x \leq 3$, $0 < z < 0.3$, $0 < y \leq 4$), $K_2TiF_6:Mn^{4+}$, $NaYF_4:Mn^{4+}$, $NaGdF_4:Mn^{4+}$, $K_3SiF_7:Mn^{4+}$ |

The wavelength conversion material may include quantum dots (QD) provided to replace or to be mixed with phosphors.

FIG. 16 is a cross-sectional view of a quantum dot. A quantum dot (QD) may have a core-shell structure including Group II-VI or Group III-V compound semiconductors. For example, the quantum dot may have a core such as CdSe or InP and/or a shell such as ZnS or ZnSe. Also, the quantum dot may include a ligand to stabilize the core and shell. For example, the core and shell may have a diameter ranging from 1 nm to 30 nm. In some embodiments, the core and shell may have a diameter ranging from 3 nm to 10 nm. The core may have a thickness of about 2 nm, and the shell may have a thickness ranging from 0.1 nm to 20 nm. In some embodiments, the shell may have a thickness ranging from 0.5 nm to 2 nm.

The quantum dot may implement various colors according to size. For example, when the quantum dot is used as a phosphor substitute, it may be used as a red or green phosphor, and the quantum dot may implement a narrow FWHM (e.g., about 35 nm).

The wavelength conversion material may be implemented in the form of being contained in an encapsulator (referring, for example, to FIGS. 11 and 12). Alternatively, the wavelength conversion material may be manufactured in advance as a film and attached to a surface of an optical structure, such as an LED chip or a light guide plate, for use (referring, for example, to FIGS. 22, 23A, and 23B). In this case, the wavelength conversion material having a uniform thickness may be easily applied to a desired region.

FIGS. 17 through 25 are views illustrating backlight units including an LED driving apparatus according to certain exemplary embodiments.

Figure 17:
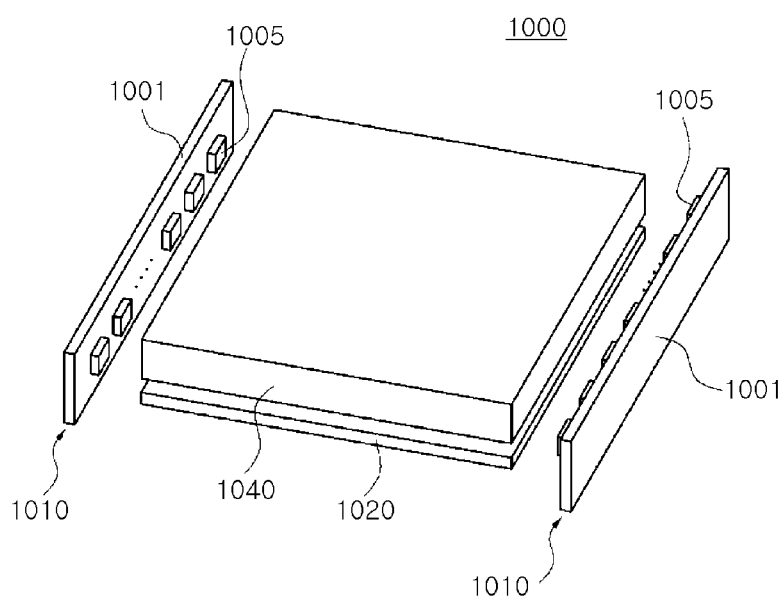
FIGS. 17 through 25 are views illustrating backlight units including an LED driving apparatus according to certain exemplary embodiments.

Referring to FIG. 17, a backlight unit 1000 may include a light guide plate 1040 and light source modules 1010 provided on both sides of the light guide plate 1040. Also, the backlight unit 1000 may further include a reflective plate 1020 disposed below the light guide plate 1040. The backlight unit 1000 according to the present exemplary embodiment may be an edge type backlight unit.

According to an exemplary embodiment, the light source module 1010 may be provided only on one side or the other of the light guide plate 1040, or on both sides of the light guide plate. The light source module 1010 may include a printed circuit board (PCB) 1001 and a plurality of light sources 1005 mounted on an upper surface of the PCB 1001. The plurality of light sources 1005 may be driven by the LED driving apparatus 110, 210, or 310, such as described above in connection with FIGS. 1 through 7.

Figure 18:
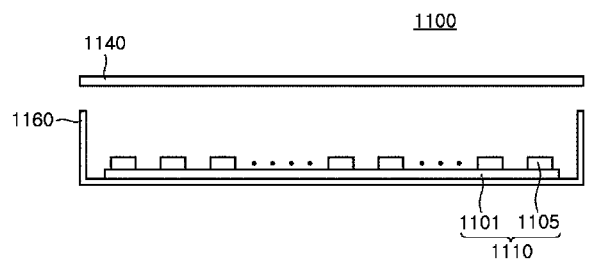

FIG. 18 is a view illustrating an exemplary embodiment of a direct type backlight unit.

Referring to FIG. 18, a backlight unit 1100 may include a light diffuser 1140 and a light source module 1110 arranged below the light diffuser 1140. Also, the backlight unit 1100 may further include a bottom case 1160 disposed below the light diffuser 1140 and accommodating the light source module 1110. For example, the light source module 1110 may be contained within the bottom case 1160. The backlight unit 1100 according to the present exemplary embodiment may be a direct type backlight unit.

The light source module 1110 may include a PCB 1101 and a plurality of light sources 1105 mounted on an upper surface of the PCB 1101. The plurality of light sources 1105 may be driven by the LED driving apparatus 110, 210, or 310, such as described above in connection with FIGS. 1 through 7.

Figure 19:
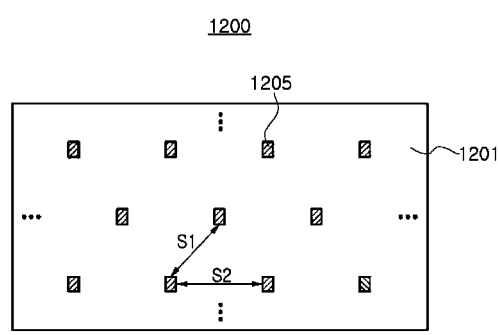

FIG. 19 is a view illustrating an example of disposition of light sources in the direct type backlight unit.

A direct type backlight unit 1200 according to the present exemplary embodiment may include a plurality of light sources 1205 arranged on a board 1201.

The arrangement structure of the light sources 1205 is a matrix structure in which the light sources 1205 are arranged in rows and columns, and here, the rows and columns have a zigzag form. A zigzag form may be a structure in which a second matrix having the same form as that of a first matrix is disposed within the first matrix in which the plurality of light sources 1205 are arranged along rows and columns in straight lines. For example, each light source 1205 of the second matrix is positioned within a quadrangle formed by four adjacent light sources 1205 included in the first matrix.

However, in the direct type backlight unit according to the exemplary embodiment illustrated in FIG. 19, in order to enhance uniformity of brightness and light efficiency, the first and second matrices may have different disposition structures and intervals. Also, in addition to the method of disposing the plurality of light sources, distances S1 and S2 between adjacent light sources may be optimized to secure uniformity of brightness.

Since the rows and columns of the light sources 1205 are disposed in a zigzag manner, rather than being disposed in straight lines, the number of light sources 1205 may be reduced by about 15% to 25% with respect to the same light emitting area.

Figure 20:
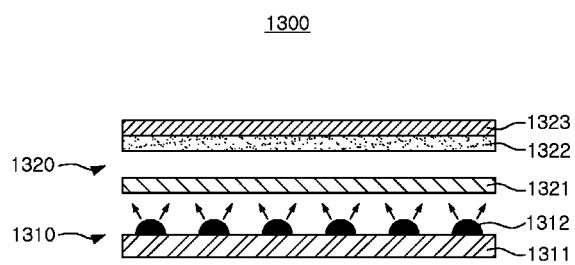

FIG. 20 is a view illustrating another exemplary embodiment of a direct type backlight unit.

Referring to FIG. 20, a backlight unit 1300 according to the present exemplary embodiment may include an optical sheet 1320 and a light source module 1310 arranged below the optical sheet 1320.

The optical sheet 1320 may include a diffusion sheet 1321, a light collecting sheet 1322, a protective sheet 1323, and the like. A configuration and arrangement order of the sheets 1321 to 1323 included in the optical sheet 1320 are not limited to those illustrated in FIG. 20, and may be variously modified.

The light source module 1310 may include a circuit board 1311, and a plurality of light sources 1312 mounted on the circuit board 1311. The plurality of light sources 1312 may be driven by the LED driving apparatus 110, 210, or 310, such as described above in connection with FIGS. 1 through 7, and an optical member adjusting a path of light emitted from the light sources 1312 may be provided on the light sources 1312.

The optical member may adjust a beam angle of light through refraction. For example, a wide beam angle lens diffusing light from the light sources 1312 to a wide region may be used as the optical member. Since the light sources 1312 with the optical member attached thereto may have wider light distribution, when the light source module is used in a backlight, planar lighting, and the like, the number of light sources 1312 required for the same area may be reduced.

Figure 21:
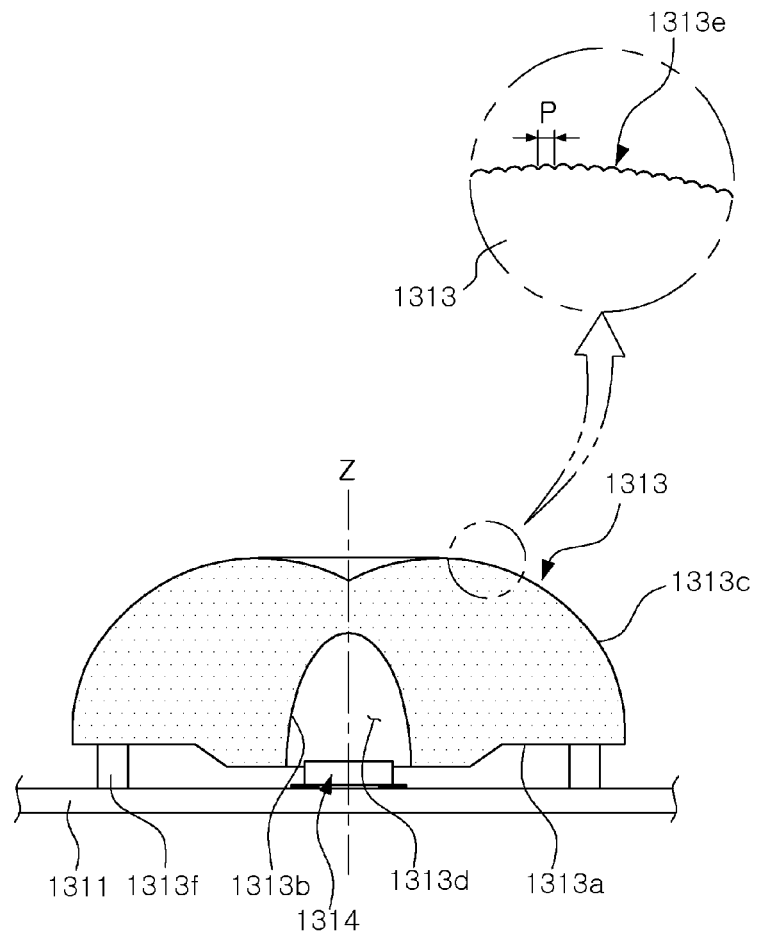

FIG. 21 is an enlarged view of the light source unit 1312 illustrated in FIG. 20.

Referring to FIG. 21, each of the plurality of light source units 1312 may include a light source 1314 including, for example, the light emitting device package 100, 200, 300, or 400 and the optical member 1313. The optical member 1313 may include a bottom surface 1313*a* disposed on the light source 1314, an incident surface 1313*b* to which light from the light source 1314 is incident, and an exit surface 1313*c* from which light is emitted outwardly.

The bottom surface 1313*a* may have a recess portion 1313*d* formed in the center through which an optical axis Z passes, and depressed in a direction toward the exit surface 1313*c*. For example, the recess portion 1313*d* may have a convex shape relative to the light source 1314. A surface of the recess portion 1313*d* may be defined as the incident surface 1313*b* to which light from the light source 1314 is incident. For example, the incident surface 1313*b* may form the surface of the recess portion 1313*d*.

A central region of the bottom surface 1313*a* connected to the incident surface 1313*b* partially protrudes to the light source 1314, forming an overall non-flat structure. For example, unlike a general structure in which the entirety of the bottom surface 1313*a* is flat or planar, the bottom surface 1313*a* has a structure in which portions thereof protrude along the circumference of the recess portion 1313*d*. A plurality of support portions 1313*f* may be provided on the bottom surface 1313*a*, and when the optical member 1313 is mounted on the circuit board 1311, the plurality of support portions 1313*f* may fixedly support the optical member 1313.

The exit surface 1313*c* protrudes to have a dome shape in an upward direction (a light output direction) from the edge connected to the bottom surface 1313*a*. The center of the exit surface 1313*c*, through which the optical axis Z passes, is depressed to be concave in the direction of the recess portion 1313*d*, having a point of inflection.

A plurality of irregular portions 1313*e* may be periodically arranged in a direction from the optical axis Z toward the edge. The plurality of irregular portions 1313*e* may have an annular shape corresponding to a horizontal cross-sectional shape of the optical element 1313, and may form a concentric circle with respect to the optical axis Z. The plurality of irregular portions 1313*e* may be arranged to be radially spread in period patterns on the surface of the exit surface 1313*c* with the optical axis Z as a center.

The plurality of irregular portions 1313*e* may be spaced apart by a predetermined period (pitch) P so as to form patterns. In this case, the period P between the plurality of irregular portions 1313*e* may range from 0.01 mm to 0.0 mm. The plurality of irregular portions 1313*e* may cancel out a difference in performance between optical elements due to a fine processing error that may occur during a process of manufacturing the optical elements 1313, thereby enhancing uniformity of light distribution.

Figure 22:
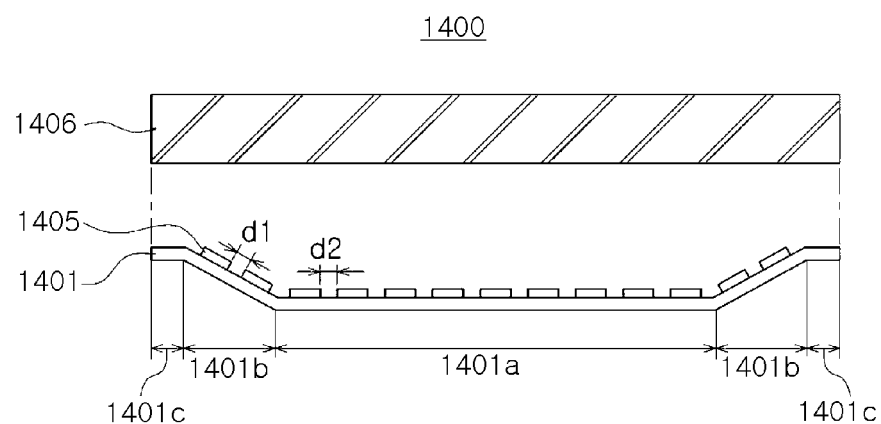

FIG. 22 is a view illustrating another embodiment of a direct type backlight unit.

Referring to FIG. 22, a backlight unit 1400 includes at least one light source 1405 mounted on a circuit board 1401 and at least one optical sheet 1406 disposed thereabove. The light source 1405 may be driven by the LED driving apparatus 110, 210, or 310, such as described above in connection with FIGS. 1 through 7.

The circuit board 1401 employed in the present exemplary embodiment may have a first planar portion 1401*a* corresponding to a main region, a sloped portion 1401*b* disposed around the first planar portion 1401*a* and bent in at least a portion thereto, and a second planar portion 1401*c* disposed on the edge of the circuit board 1401, namely, an outer side of the sloped portion 1401*b*. For example, the sloped portion 1401*b* may slope from the first planar portion 1401*a* to the second planar portion 1401*a*. One or more light sources 1405 may be arranged at a first interval d2 on the first planar portion 1401*a*, and one or more light sources 1405 may be arranged at a second interval d1 on the sloped portion 1401*b*. The first interval d2 may be equal to the second interval d1. A width of the sloped portion 1401*b* (or a length in the cross-section) may be smaller than that of the first planar portion 1401*a*, and may be larger than a width of the second planar portion 1401*c*. Also, in some embodiments, one or more light source 1405 may be arranged on the second planar portion 1401*c*.

A slope of the sloped portion 1401*b* may be adjusted within a range from 0 to 90 degrees with respect to the first planar portion 1401*a*, and within a range from 270 degrees to 360 degrees with respect to the second planar portion 1401*c*. With this structure, the circuit board 1401 may maintain uniform brightness even in the vicinity of the edges of the optical sheet 1406.

Figure 23:
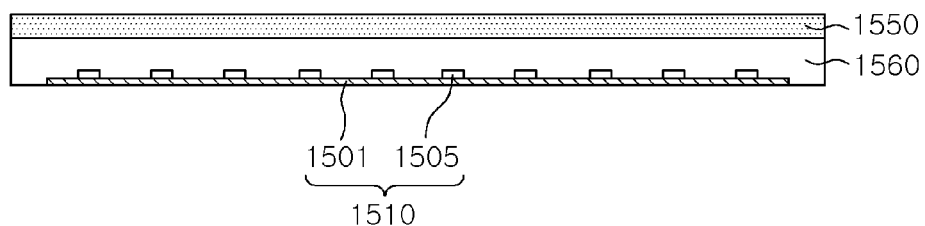
Figure 24:
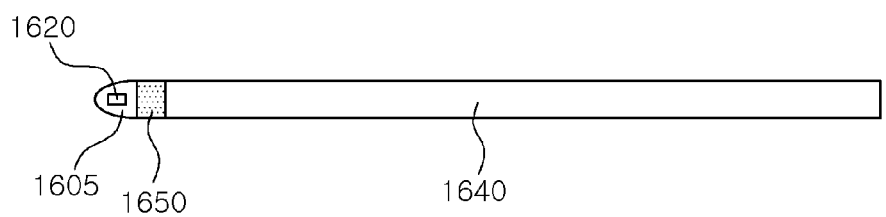
Figure 25:
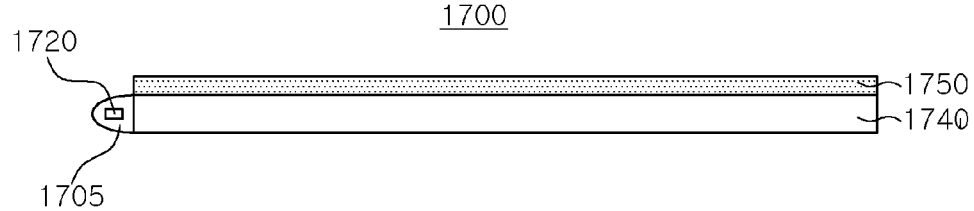

In the exemplary backlight units 1500, 1600, and 1700, disclosed in FIGS. 23 through 25, exemplary wavelength conversion units 1550, 1650, and 1750 are respectively disposed outside of light sources 1505, 1605, and 1705, rather than being disposed in the light sources 1505, 1605, and 1705, to convert light.

Referring to FIG. 23, the backlight unit 1500 is a direct type backlight unit including the wavelength conversion unit 1550, a light source module 1510 arranged below the wavelength conversion unit 1550, and a bottom case 1560 accommodating the light source module 1510. The light source module 1510 may include a PCB 1501 and a plurality of light sources 1505 mounted on an upper surface of the PCB 1501.

In the backlight unit 1500 according to the exemplary embodiment of FIG. 23, the wavelength conversion unit 1550 may be disposed above the bottom case 1560. In some embodiments, at least a portion of light emitted from the light source module 1510 may be wavelength-converted by the wavelength conversion unit 1550. The wavelength conversion unit 1550 may be manufactured as a separate film and applied. Alternatively, the wavelength conversion unit 1550 may be integrally combined with a light diffuser (not shown).

Referring to FIGS. 24 and 25, backlight units 1600 and 1700 are edge type backlight units respectively including wavelength conversion units 1650 and 1750, light guide plates 1640 and 1740, and reflective units 1620 and 1720 and light sources 1605 and 1705 disposed on one side of the light guide plates 1640 and 1740.

Light emitted from the light sources 1605 and 1705 may be guided to the interior of the light guide plates 1640 and 1740 by the reflective units 1620 and 1720, respectively. In the exemplary backlight unit 1600 of FIG. 24, the wavelength conversion unit 1650 may be disposed between the light guide plate 1640 and the light source 1605. In the exemplary backlight unit 1700 of FIG. 25, the wavelength conversion unit 1750 may be disposed on a light emitting surface of the light guide plate 1740.

In FIGS. 23 through 25, the wavelength conversion units 1550, 1650, and 1750 may include a general phosphor. For example, when using a quantum dot phosphor to complement characteristics of a quantum dot vulnerable to heat or moisture from a light source, the structures of wavelength conversion units 1550, 1650, and 1750 illustrated in FIGS. 23 through 25 may be utilized in the backlight units 1500, 1600, and 1700.

Figure 26:
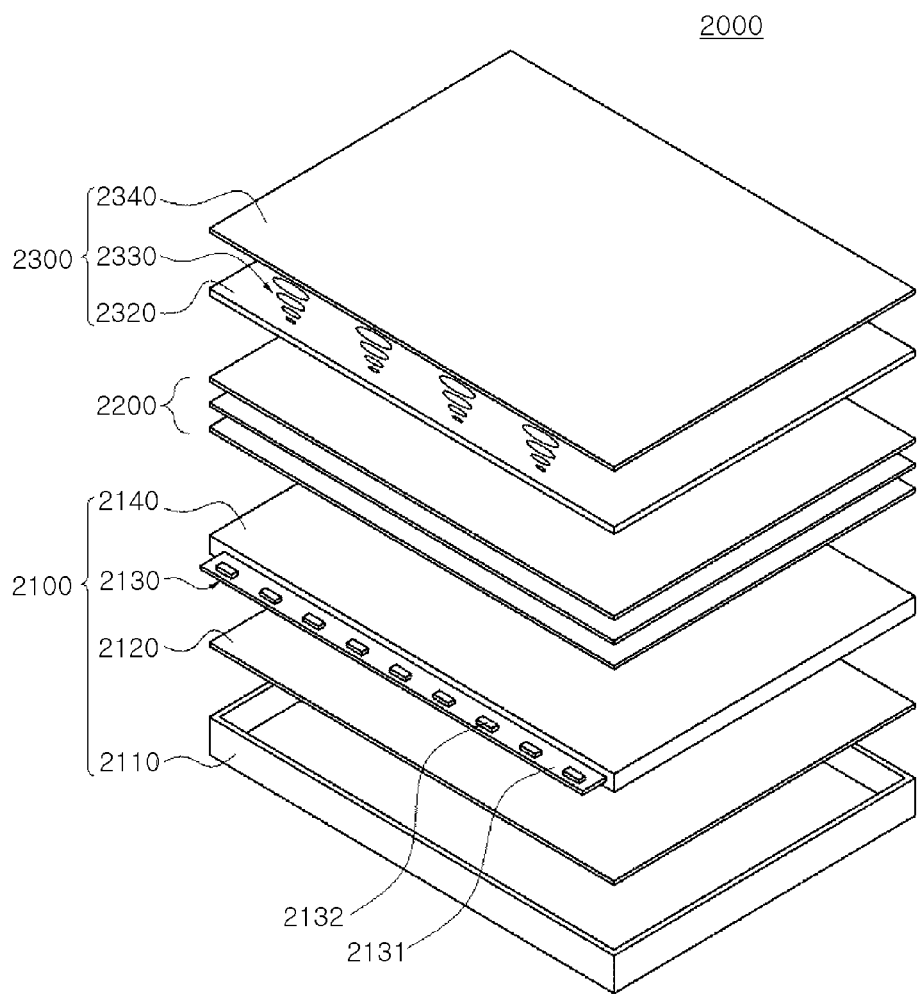
FIG. 26 is an exploded perspective view schematically illustrating a display apparatus that employs a backlight unit including an LED driving apparatus according to certain exemplary embodiments.

FIG. 26 is an exploded perspective view schematically illustrating a display apparatus 2000 including a light emitting device package according to an exemplary embodiment.

Referring to FIG. 26, a display apparatus 2000 may include a backlight unit 2100, an optical sheet 2200, and an image display panel 2300 such as, for example, a liquid crystal display panel.

The backlight unit 2100 may include a bottom case 2110, a reflective plate 2120, a light guide plate 2140, and a light source module 2130 provided on at least one side of the light guide plate 2140. For example, a light source module 2130 may be provided on at least one external side of the light guide plate 2140. The light source module 2130 may include a PCB 2131 and light sources 2132. In some embodiments, the light sources 2132 may be driven by the exemplary LED driving apparatus 110, 210, or 310, as described above in connection with FIGS. 1 through 7.

The optical sheet 2200 may be disposed between the light guide plate 2140 and the image display panel 2300 and may include a plurality of sheets of various types, such as, for example, diffusion sheets, prism sheets, protective sheets, etc.

The image display panel 2300 may display an image using light output from the optical sheet 2200. The image display panel 2300 may include an array substrate 2320, a liquid crystal layer 2330, and a color filter substrate 2340. The array substrate 2320 may include pixel electrodes disposed in a matrix form, thin film transistors (TFTs) applying a driving voltage to the pixel electrodes, and signal lines operating the TFTs. Although not illustrated, the color filter substrate 2340 may include a transparent substrate, a color filter, and a common electrode. The color filter may include filters allowing light having a particular wavelength, included in white light emitted from the backlight unit 2100, to selectively pass therethrough. The liquid crystal layer 2330 may be rearranged by an electric field interposed between the pixel electrodes and the common electrode to adjust light transmittance. Light adjusted in transmittance may pass through the color filter of the color filter substrate 2340, thus displaying an image. The image display panel 2300 may further include a driving circuit unit processing an image signal or the like.

The display apparatus 2000 according to the present exemplary embodiment uses the light sources 2132 emitting blue light, green light, and red light having a relatively small FWHM. Thus, after passing through the color filter substrate 2340, emitted light may realize blue, green, and red colors having a high level of color purity.

FIGS. 27 through 30 are views illustrating lighting devices including a light emitting device package according to an exemplary embodiment.

Figure 27:
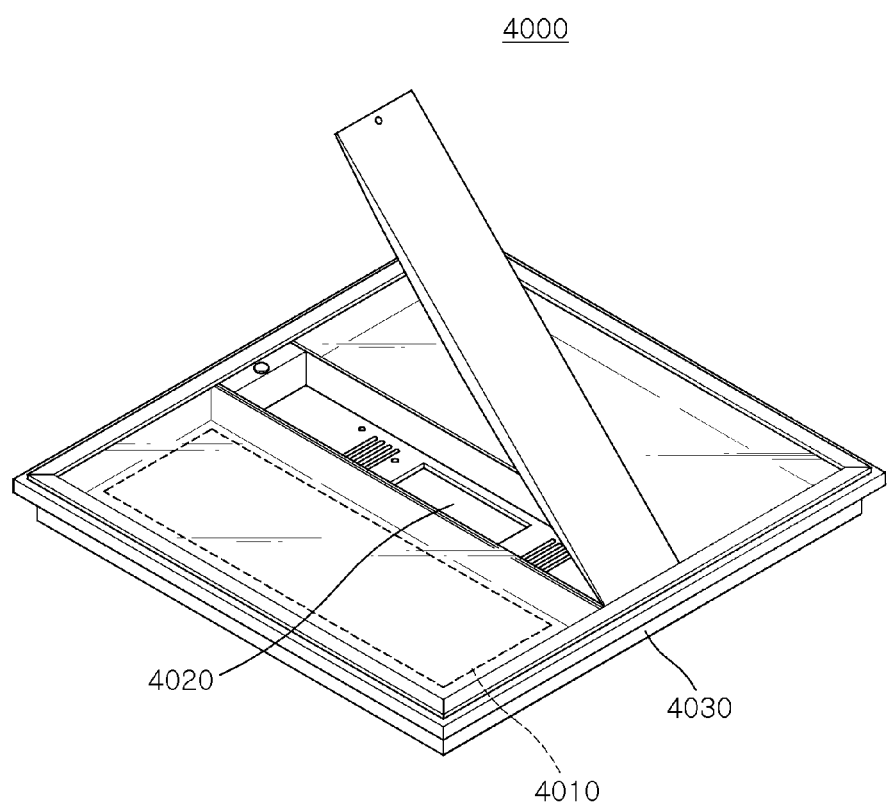
FIGS. 27 through 30 are views illustrating lighting devices according to certain exemplary embodiments.

Referring to FIG. 27, a planar type lighting device 4000 may include a light source module 4010, a power supply device 4020, and housing 4030. According to an exemplary embodiment, the light source module 4010 may include a light emitting device array as a light source, and the power supply device 4020 may include a light emitting device driving unit. The light source and light emitting device driving unit may include, for example, light sources 120, 220, and 320 and light emitting device driving apparatus 110, 210, and 310, as disclosed and discussed in connection with FIGS. 1 through 7.

The light source module 4010 may include a light emitting device array and may be formed to have an overall planar shape. According to an exemplary embodiment, the light emitting device array may include a light emitting device and a controller including memory for storing driving information of the light emitting device. Here, the light emitting device array may include a plurality of light emitting device packages connected in series or parallel to each other.

The power supply device 4020 may be configured to supply power to the light source module 4010. The housing 4030 may have an accommodation space accommodating the light source module 4010 and the power supply device 4020 therein and have a hexahedral shape with one side thereof opened, but the shape of the housing 4030 is not limited thereto. The light source module 4010 may be disposed to emit light to the opened one side of the housing 4030.

Figure 28:
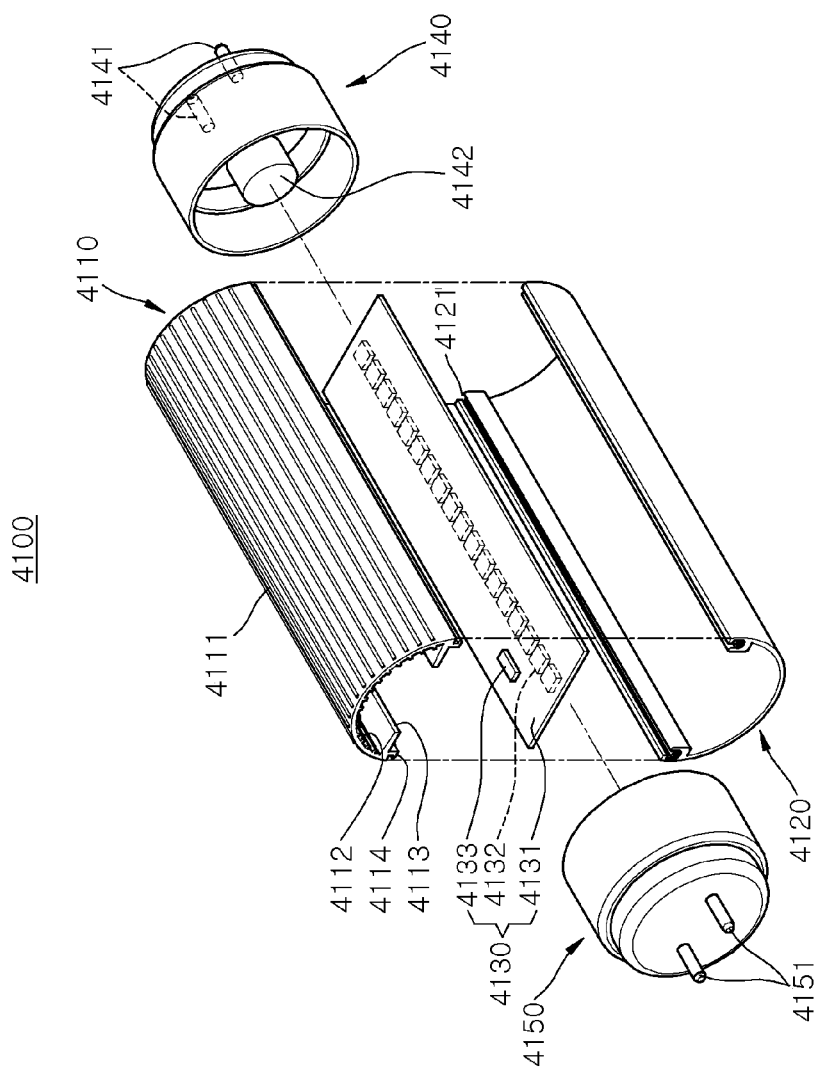

FIG. 28 is an exploded perspective view schematically illustrating a bar type lamp as a lighting device according to an exemplary embodiment.

Referring to FIG. 28, a lighting device 4100 includes a heat sink 4110, a cover 4120, a light source module 4130, a first socket 4140, and a second socket 4150. A plurality of heat sink fins 4111 and 4112 may be formed in a concave-convex pattern on an internal and/or external surface of the heat sink 4110. The heat sink fins 4111 and 4112 may be designed to have various shapes and intervals (spaces) therebetween. A support 4113 having a protruding shape is formed on an inner side of the heat sink 4110. The light source module 4130 may be fixed to the support 4113. Stoppage protrusions 4114 may be formed at both ends of the heat sink 4110. For example, stoppage protrusions 4114 may be formed along opposing surface sides of the heat sink 4110, extending from one end of heat sink 4110 (e.g., near the first socket 4140) to the other end of the heat sink 4110 (e.g., near the second socket 4150).

Stoppage recesses 4121 may be formed in the cover 4120, and the stoppage protrusions 4114 of the heat sink 4110 may be coupled to the stoppage recesses 4121 in a hook coupling manner. The stoppage recesses 4121 may be formed along opposing surface sides of the cover 4120, extending from one end of heat sink 4110 (e.g., near the first socket 4140) to the other end of the heat sink 4110 (e.g., near the second socket 4150. The positions of the stoppage recesses 4121 and the stoppage protrusions 4114 may be interchanged. For example, the stoppage recesses 4121 may be formed in the heat sink 4110, and the stoppage protrusions 4114 may be formed in the cover 4120.

The light source module 4130 may include a light emitting device array. The light source module 4130 may include a PCB 4131, a light source 4132, and a controller 4133. As described above, the controller 4133 may include a memory that stores driving information of the light source 4132. Circuit wirings are formed on the PCB 4131 to operate the light source 4132. Also, components for operating the light source 4132 may be provided on the PCB 4131. For example, the LED driving apparatuses 110, 210, and 310, such as described above in connection with FIGS. 1 through 7, may be realized on the PCB 4131, and the controller 4133 may perform the functions of the controller ICs 112, 212, and 312 described above with reference to FIGS. 1 through 7.

The first and second sockets 4140 and 4150, a pair of sockets, are coupled to both ends of the cylindrical cover unit formed by the heat sink 4110 and the cover 4120. For example, the first socket 4140 may include electrode terminals 4141 and a power source device 4142, and the second socket 4150 may include dummy terminals 4151. Although not illustrated, in some embodiments, an optical sensor and/or a communications module may be installed in either the first socket 4140 or the second socket 4150. For example, the optical sensor and/or the communications module may be installed in the second socket 4150 in which the dummy terminals 4151 are disposed. In another example, the optical sensor and/or the communications module may be installed in the first socket 4140 in which the electrode terminals 4141 are disposed.

Figure 29:
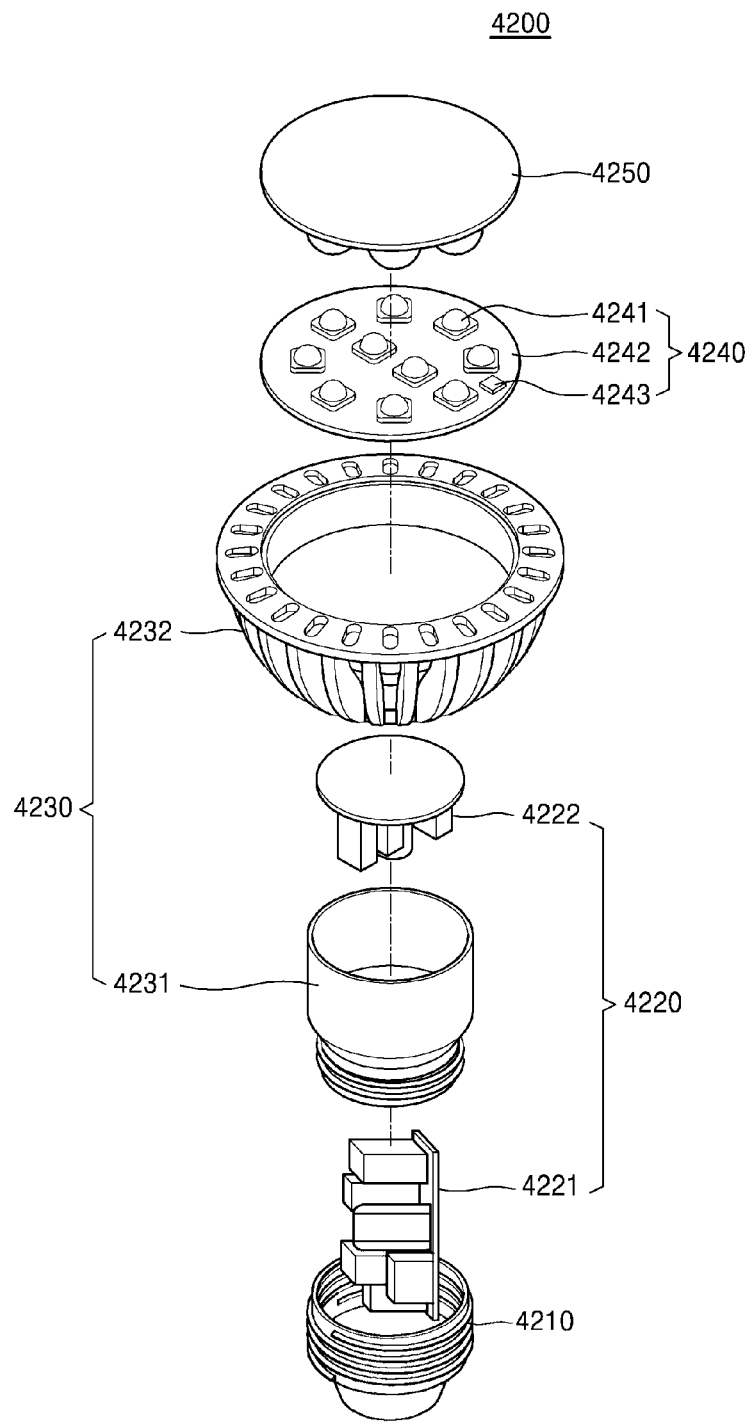

FIG. 29 is an exploded perspective view schematically illustrating a bulb-type lamp as a lighting device according to an exemplary embodiment.

In FIG. 29, a lighting device 4200 may include a socket 4210, a power source unit 4220, a heat sink 4230, a light source module 4240, and an optical unit 4250. According to an exemplary embodiment, the light source module 4240 may include a light emitting device array, and the power source unit 4220 may include the exemplary LED driving apparatuses 110, 210, and 310 described above with reference to FIGS. 1 through 7.

The socket 4210 may be configured to be used with an existing lighting device. For example, the socket 4210 may allow the lighting device 4200 to be used as a replacement lighting device in traditional lighting apparatuses. Power supplied to the lighting device 4200 may be applied through the socket 4120. As illustrated, the power source unit 4220 may include a first power source unit 4221 and a second power source unit 4222. The first power source unit 4221 and the second power source unit 4222 may be assembled to form the power source unit 4220. The heat sink 4230 may include an internal heat sink 4231 and an external heat sink 4232. The internal heat sink 4231 may be directly connected to the light source module 4240 and/or the power source unit 4220 in order to transmit heat to the external heat sink 4232. The optical unit 4250 may include an internal optical unit (not shown) and an external optical unit (not shown), and may be configured to evenly distribute light emitted from the light source module 4240.

The light source module 4240 may emit light to the optical unit 4250 upon receiving power from the power source unit 4220. The light source module 4240 may include one or more light emitting devices 4241, a circuit board 4242, and a controller 4243. The controller 4243 may include a memory and store driving information of the light emitting devices 4241.

Figure 30:
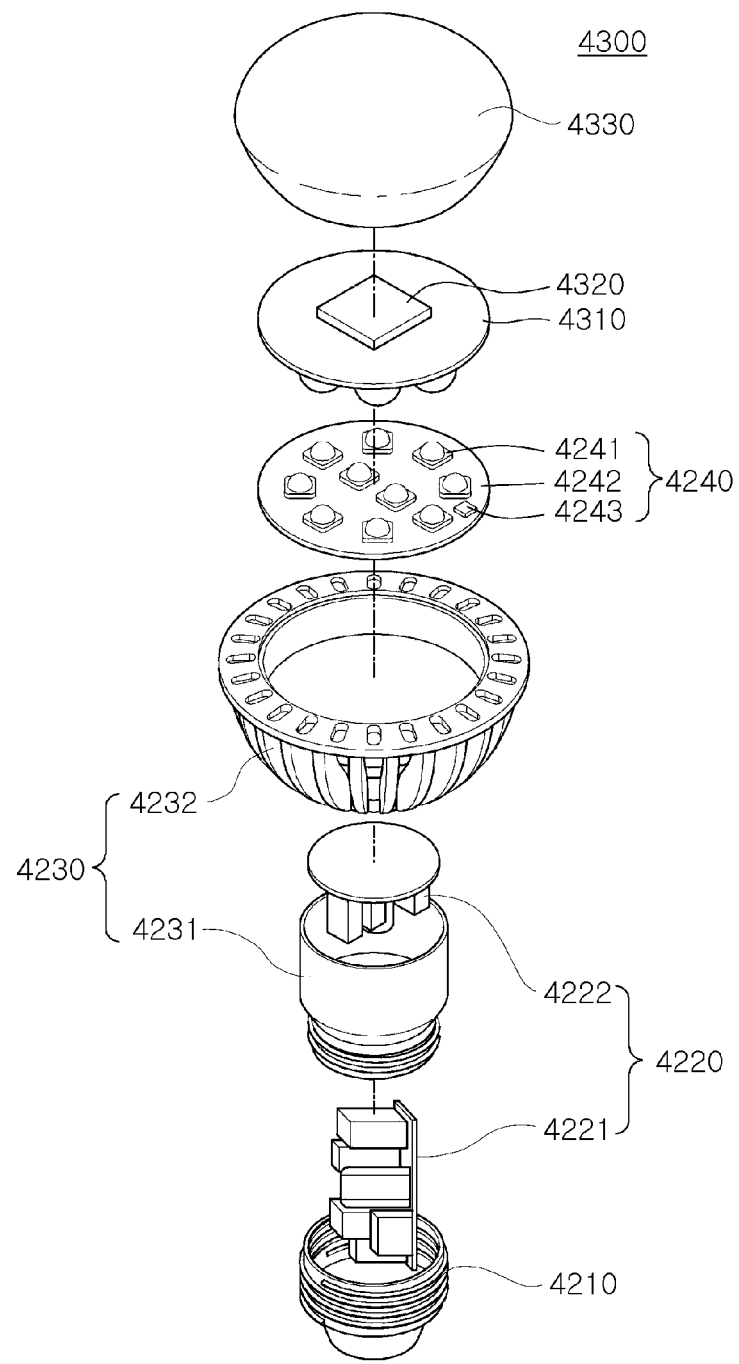

FIG. 30 is an exploded perspective view schematically illustrating a lamp, including a communications module, as a lighting device, according to an exemplary embodiment.

In FIG. 30, a lighting device 4300 according to the present exemplary embodiment is different from the lighting device 4200 illustrated in FIG. 29 in that a reflective plate 4310 is provided above the light source module 4240, and here, the reflective plate 4310 serves to allow light from the light source to be evenly spread laterally and backwardly, reducing glare.

A communications module 4320 may be mounted on an upper portion of the reflective plate 4310, and home network communication may be implemented through the communications module 4320. For example, the communications module 4320 may be a wireless communications module using, for example, ZigBee, Wi-Fi, Bluetooth, visible light communications (VLC) technology (or light fidelity (Li-Fi)), etc., and may control lighting installed within or outside of a household, such as turning on or off a lighting device, adjusting brightness of a lighting device, and the like, using a mobile electronic device, smartphone, wireless controller, etc. Also, home appliances or an automobile system within or outside of a household, such as a TV, a refrigerator, an air-conditioner, a door lock, automobiles, etc., may be controlled through a Li-Fi communications module using visible wavelengths of the lighting device installed within or outside of the household. The reflective plate 4310 and the communications module 4320 may be covered by a cover unit 4330.

Figure 31:
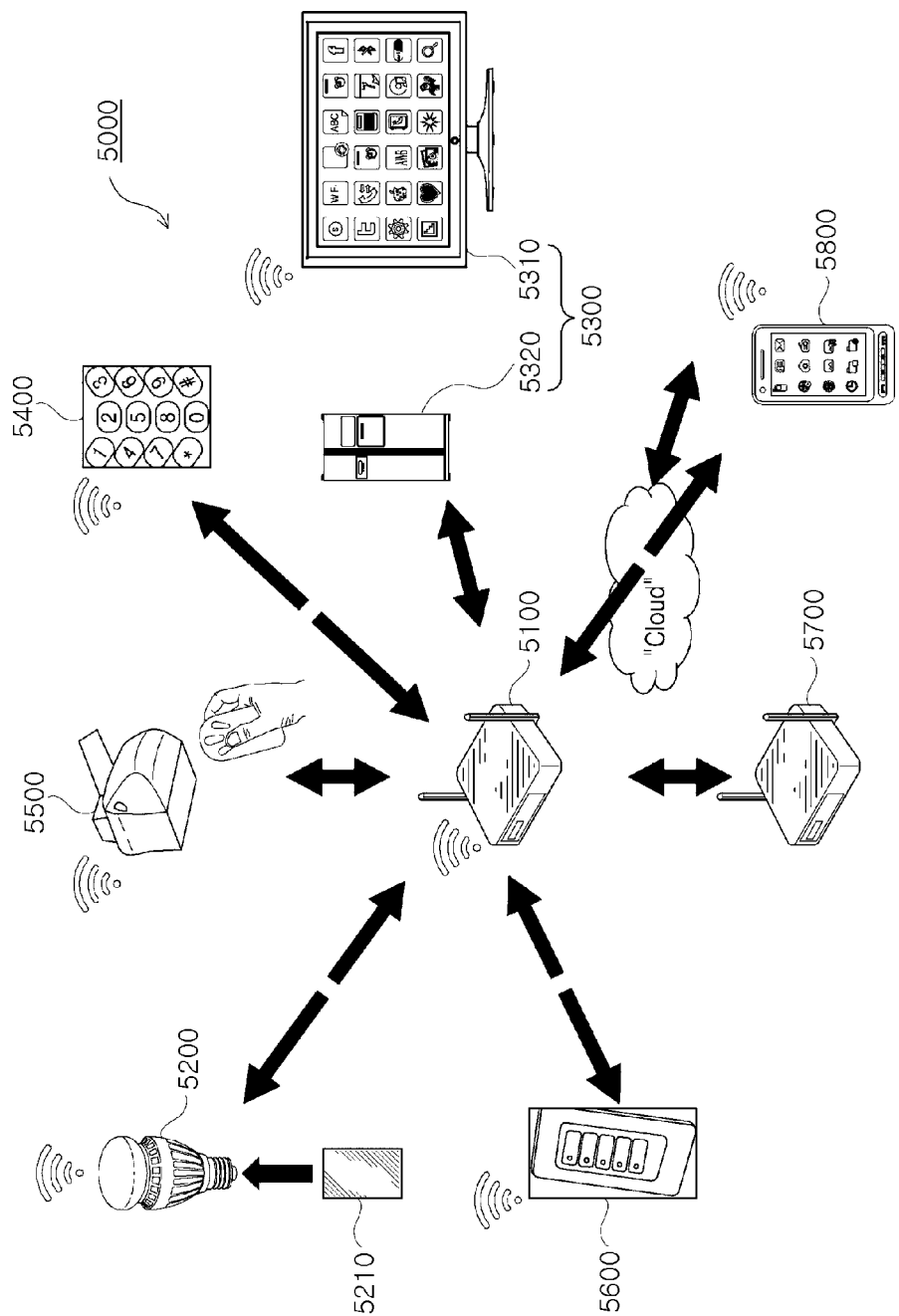
FIGS. 31 through 33 are schematic views illustrating a lighting network system including an LED driving apparatus according to certain exemplary embodiments.
Figure 32:
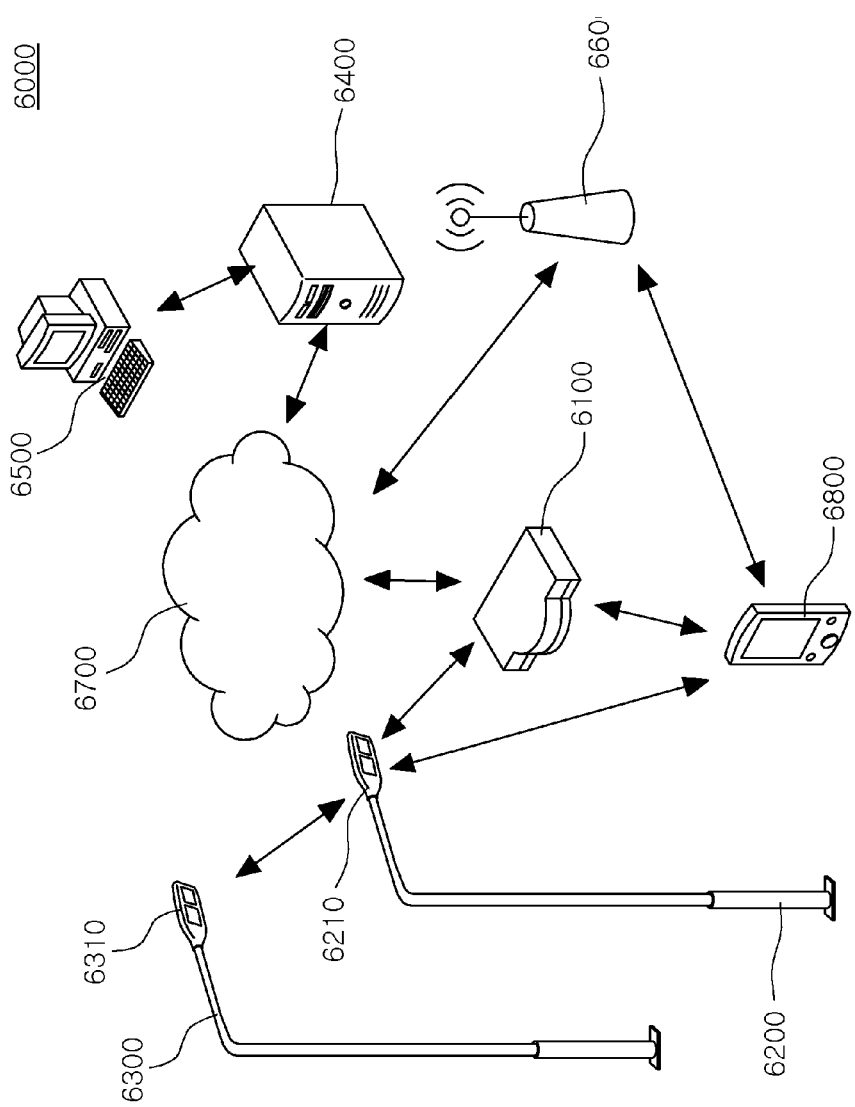
Figure 33:
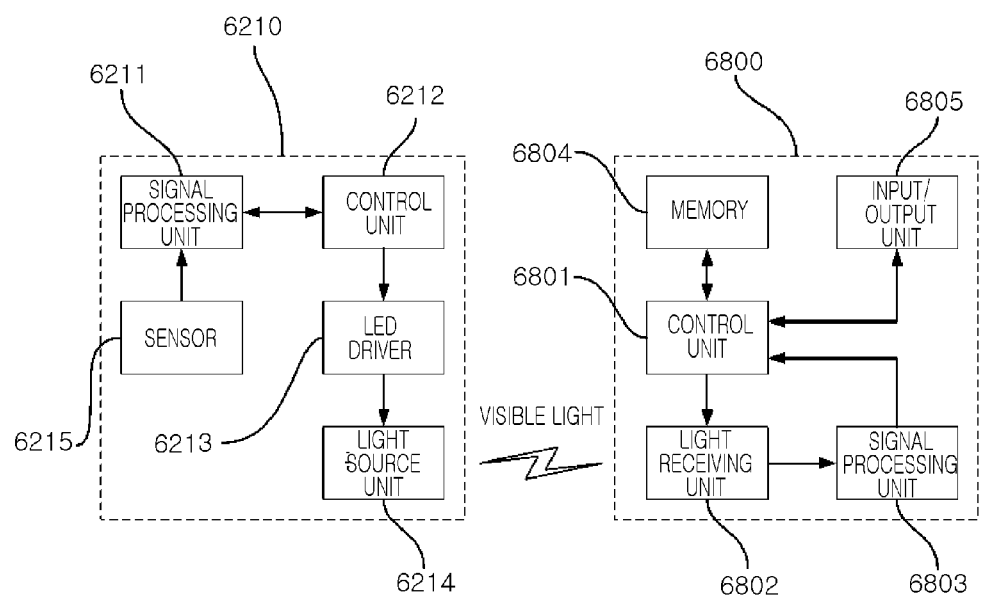

FIGS. 31 through 33 are schematic views illustrating a network system including a light emitting device package according to an exemplary embodiment.

FIG. 31 is a schematic view illustrating an indoor lighting control network system 5000. A network system 5000 according to the present exemplary embodiment may be, for example, a complex smart lighting-network system combining lighting technology using a light emitting device such as an LED or the like, Internet of Things (IoT) technology, wireless communications technology, etc. As used herein, the term "Internet of Things" refers to one or more networks of physical objects (e.g., devices, apparatuses, buildings, vehicles, etc.) that include electronics, software, sensors and/or network connectivity that enables the objects to collect and exchange data. The network system 5000 may be implemented using various lighting devices and wired/wireless communications devices, and may be implemented using one or more of a sensor, a controller, a communications unit, software for network control and maintenance, etc.

The network system 5000 may be applied even to an open space (e.g., park, street, etc.), as well as to a closed space defined within a building (e.g., home, office, etc.) or by obstructions (e.g., mountains, hills, building structures, walls, trees, etc.). The network system 5000 may be realized on the basis of the IoT environment in order to collect and process a variety of information and provide the same to users. Here, an LED lamp 5200 included in the network system 5000 may serve to check and control operational states of other devices 5300 to 5800 (i.e., 5300, 5400, 5500, 5600, 5700, and 5800) included in the IoT environment on the basis of a function such as visible light communications, or the like, of the LED lamp 5200. The LED lamp 5200 may also function to receive information regarding a surrounding environment from a gateway 5100 and control lighting of the LED lamp 5200 itself.

Referring to FIG. 31, the network system 5000 may include the gateway 5100 processing data transmitted and received according to different communications protocols, the LED lamp 5200 connected to be available for communicating with the gateway 5100 and including an LED light emitting device, and a plurality of devices 5300 to 5800. The plurality of devices 5300 to 5800 and LED lamp 5200 may be connected to and available for communicating with the gateway 5100 according to various wireless communications schemes. For example, each of the plurality of devices 5300 to 5800 and LED lamp 5200 may form a communication connection with gateway 5100, and transmit/receive data and instructions to/from gateway 5100. In order to realize the network system 5000 in an IoT environment, each of the devices 5300 to 5800, as well as the LED lamp 5200, may include at least one communications module. In an exemplary embodiment, the LED lamp 5200 may be connected to be available for communicating with the gateway 5100 according to wireless communication protocols such as Wi-Fi, ZigBee, Bluetooth, Li-Fi, etc., and the LED lamp 5200 may include at least one communications module 5210.

As mentioned above, the network system 5000 may be applied even to an open space such as a park or a street, as well as to a closed space such as a home or an office. When the network system 5000 is applied to a home, for example, the plurality of devices 5300 to 5800 included in the network system and connected to be available for communicating with the gateway 5100 on the basis of the IoT technology may include a home appliance 5300, a digital door lock 5400, a garage door lock 5500, a light switch 5600 installed on a wall, or the like, a router 5700 for relaying a wireless communications network, and a mobile device 5800 such as a smartphone, a tablet PC, or a laptop computer.

In the network system 5000, the LED lamp 5200 may check operational states of various devices 5300 to 5800 using the wireless communications network (ZigBee, Wi-Fi, LI-Fi, etc.) installed in a household or may automatically control illumination of the LED lamp 5200 itself according to a surrounding environment or situation. Also, the devices 5300 to 5800 included in the network system 500 may be controlled using Li-Fi communications using visible light emitted from the LED lamp 5200.

First, the LED lamp 5200 may automatically adjust illumination of the LED lamp 5200 on the basis of information of a surrounding environment transmitted from the gateway 5100 through the communications module 5210 for an LED lamp 5200 or information of a surrounding environment collected from a sensor installed in the LED lamp 5200. For example, brightness of illumination of the LED lamp 5200 may be automatically adjusted according to types of programs broadcast on the TV 5310 or brightness of a screen of the TV 5310. To this end, the LED lamp 5200 may receive operation information of the TV 5310 from the communications module 5210 for an LED lamp 5200 connected to the gateway 5100. The communications module 5210 may be integrally modularized with a sensor and/or a controller included in the LED lamp 5200.

For example, in a case in which a program broadcast on TV is a drama, the network system 5000 may be configured to decrease a color temperature of illumination to be 12000K or lower, for example, to 5000K, and a color tone may be adjusted according to preset values to present a cozy atmosphere. Conversely, when a program is a comedy, the network system 5000 may be configured so that a color temperature of illumination is increased to 5000K or higher according to a preset value and illumination is adjusted to blue-based white light.

Also, in a situation in which there are no persons in a home, when a predetermined time has lapsed after the digital door lock 5400 is locked, all of the turned-on LED lamps 5200 are turned off to prevent a waste of electricity. Also, in a case in which a security mode is set through the mobile device 5800, or the like, when the digital door lock 5400 is locked with no one in a home, the LED lamp 5200 may be maintained in a turned-on state.

An operation of the LED lamp 5200 may be controlled according to surrounding environmental conditions collected through various sensors connected to the network system 5000. For example, in a case in which the network system 5000 is realized in a building, lighting, a position sensor, and a communications module are combined in the building, and position information of people in the building is collected and lighting is turned on or turned off, or the collected information may be provided in real time to effectively manage facilities or effectively utilize an idle space. In some embodiments, a lighting device such as the LED lamp 5200 may be disposed in almost every space of each floor of a building, and thus, various types of information of the building may be collected through a sensor integrally provided with the LED lamp 5200 and used for managing facilities and utilizing an idle space.

The LED lamp 5200 may be combined with an image sensor, a storage device, and the communications module 5210 for a lamp, so as to be utilized as a device for maintaining building security or for sensing and coping with an emergency situation. For example, in a case in which a smoke or temperature sensor, or the like, is attached to the LED lamp 5200, a fire may be promptly sensed to minimize damage. Also, brightness of lighting may be adjusted in consideration of outside conditions (e.g., weather, an amount of sunshine, etc.) thereby saving energy and providing an agreeable illumination environment.

As described above, the network system 5000 may also be applied to an open space such as a street or a park, as well as to a closed space such as a house, an office, or a building. In a case in which the network system 5000 is intended to be applied to an open space without physical limitations, it may be difficult to realize the network system 5000 due to a limitation in a distance of wireless communications or communications interference due to various obstacles. In this case, a sensor, a communications module, and the like, may be installed in each lighting fixture, and each lighting fixture may be used to collect information or to relay communications, allowing the network system 5000 to be more effectively realized in an open environment. This will hereinafter be described with reference to FIG. 32.

FIG. 32 is a view illustrating an exemplary embodiment of a network system 6000 applied to an open space. Referring to FIG. 32, a network system 6000 according to the present exemplary embodiment may include a communications connection device 6100, a plurality of lighting fixtures 6200 and 6300, a server 6400, a computer 6500 managing the server 6400, a communications base station 6600, a communications network 6700, a mobile electronic device 6800, etc. The plurality of lighting fixtures 6200 and 6300 may be installed at predetermined intervals and connected to be available for communicating with one or more of the communications connection device 6100, the server 6400, the computer 6500, the communications base station 6600, the communications network 6700, and the mobile electronic device 6800. Further, although only two lighting fixtures 6200 and 6300 are illustrated, it is anticipated that any number of lighting fixtures may be used in network system 6000.

Each of the plurality of lighting fixtures 6200 and 6300 installed in an open outside space, such as a street or a park, may include smart engines 6210 and 6310, respectively. The smart engines 6210 and 6310 may include a light emitting device emitting light, a driver driving the light emitting device, a sensor collecting information of a surrounding environment, a communications module, etc. The smart engines 6210 and 6310 may communicate with one or more other components of network system 6000, as discussed above, by means of the communications module using communications protocols such as, for example, Wi-Fi, ZigBee, Bluetooth, Li-Fi, etc.

For example, at least one smart engine 6210 may be connected to communicate with at least another smart engine 6310. Here, a Wi-Fi extending technique (e.g., Wi-Fi mesh) may be applied to communications between the smart engines 6210 and 6310. The at least one smart engine 6210 may be connected to the communications connection device 6100 connected to the communications network 6700 by any combination of wired and/or wireless communications. In order to increase communications efficiency, some smart engines 6210 and 6310 may be grouped and connected to the single communications connection device 6100.

In some exemplary embodiments, the communications connection device 6100 may be an access point (AP) available for wired and/or wireless communications, which may relay communications between the communications network 6700 and other equipment. The communications connection device 6100 may be connected to the communications network 6700 in either a wired manner or a wireless manner, and for example, the communications connection device 6100 may be mechanically located in any one of the lighting fixtures 6200 and 6300.

The communications connection device 6100 may be connected to the mobile device 6800 through a communications protocol such as, for example, Wi-Fi, Bluetooth, etc. A user of the mobile device 6800 may receive surrounding environment information collected by the plurality of smart engines 6210 and 6310 via the communications connection device 6100 that is communicatively connected to and communicating with the smart engine 6210 of the lighting fixture 6200 adjacent to the mobile device 6800. The surrounding environment information may include nearby traffic information, weather information, etc. The mobile device 6800 may be connected to the communications network 6700 according to wireless cellular communication schemes, such as, for example, third-generation (3G) or fourth-generation (4G) mobile telecommunications technology through the communications base station 6600.

The server 6400 connected to the communications network 6700 may receive information collected by the smart engines 6210 and 6310, respectively installed in the lighting fixtures 6200 and 6300, and may monitor an operational state, or the like, of each of the lighting fixtures 6200 and 6300. In order to manage the lighting fixtures 6200 and 6300 on the basis of the monitoring results of the operational states of the lighting fixtures 6200 and 6300, the server 6400 may be connected to the computer 6500 providing a management system. The computer 6500 may include a processor that executes software, or the like, and may be capable of monitoring and managing operational states of the lighting fixtures 6200 and 6300 and, specifically, the smart engines 6210 and 6310.

In order to transmit information collected by the smart engines 6210 and 6310 to the mobile device 6800 of the user, various communications schemes may be applied. Referring to FIG. 37, information collected by the smart engines 6210 and 6310 may be transmitted to the mobile device 6800 through the communications connection device 6100 connected to the smart engines 6210 and 6310, or the smart engines 6210 and 6310 and the mobile device 6800 may be connected to directly communicate with each other. The smart engines 6210 and 6310 and the mobile device 6800 may directly communicate with each other by visible light communications (Li-Fi). This will hereinafter be described with reference to FIG. 33.

FIG. 33 is a block diagram illustrating a communications operation between the smart engine 6210 of the lighting fixture 6200 and the mobile device 6800 using visible light communications. Referring to FIG. 33, the smart engine 6210 may include a signal processing unit 6211, a control unit 6212, an LED driver 6213, a light source unit 6214, a sensor 6215, etc. The mobile device 6800 connected to the smart engine 6210 by visible light communications may include a control unit 6801, a light receiving unit 6802, a signal processing unit 6803, a memory 6804, an input/output unit 6805, etc.

Visible light communications (VLC) technology (or light fidelity (Li-Fi)) is a wireless communications technology transferring information wirelessly by using light having a visible light wavelength band recognizable by the naked eye. The visible light communications technology is distinguished from existing wired optical communications technology and infrared data association (IrDA) in that it uses light having a visible light wavelength band, namely, a particular visible light frequency from the light emitting device package according to the exemplary embodiment described above and is distinguished from the existing wired optical communications technology in that a communications environment is based on a wireless scheme. Also, unlike RF wireless communications, the VLC technology (or Li-Fi) has excellent convenience and physical security properties as it can be freely used without being regulated or needing permission in the aspect of frequency usage, and is differentiated in that a user can physically check a communications link. In addition, the VLC technology (or Li-Fi) has features of convergence technology that obtains both a unique purpose as a light source and a communications function.

Referring to FIG. 33, the signal processing unit 6211 of the smart engine 6210 may process data intended to be transmitted and received via VLC. In an exemplary embodiment, the signal processing unit 6211 may process information collected by the sensor 6215 into data, and transmit the processed data to the control unit 6212. The control unit 6212 may control operations of the signal processing unit 6211 and the LED driver 6213. For example, the control unit 6212 may control an operation of the LED driver 6213 on the basis of data transmitted from the signal processing unit 6211. The LED driver 6213 causes the light source unit 6214 to emit light according to a control signal transmitted from the control unit 6212, thereby transmitting data to the mobile device 6800.

The mobile device 6800 may include the light receiving unit 6802 for recognizing visible light including data. The mobile device 6800 may also include the control unit 6801, the memory 6804 storing data, the input/output unit 6805 including a display, a touchscreen, an audio output unit, and the like, and the signal processing unit 6803. The light receiving unit 6802 may sense visible light and convert the sensed visible light into an electrical signal, and the signal processing unit 6803 may decode data included in the electrical signal converted by the light receiving unit 6802. The control unit 6801 may store the data decoded by the signal processing unit 6803 in the memory 6804 or may output the decoded data through the input/output unit 6805 to allow the user to recognize the data.

As set forth above, according to exemplary embodiments, the LED driving apparatus and the lighting device in which an LED is driven directly by an output from the rectifying circuit without a converter circuit, and in particular, a flickering phenomenon occurring as all of the LED arrays do not emit light is prevented and a problem related to heat generation is solved may be provided.

While exemplary embodiments have been shown and described above, it will be apparent to those skilled in the art that modifications and variations could be made without departing from the scope of the invention as defined by the appended claims.

What is claimed is:

1. A light emitting diode (LED) driving apparatus comprising:
   a power supply circuit configured to supply driving power to a plurality of LED arrays;
   a controller integrated circuit (IC) including a plurality of internal switches respectively connected to output terminals of the plurality of LED arrays, and configured to control a path of current flowing in the plurality of LED arrays by adjusting operations of the plurality of internal switches based on a magnitude of the driving power; and
   a current control circuit connected to an output terminal of a first LED array among the plurality of LED arrays and configured to adjust current flowing to the first LED array,
   wherein while the driving power is supplied, the first LED array is constantly driven.

2. The LED driving apparatus of claim 1, wherein the current control circuit draws a portion of the current flowing in the first LED array when only the first LED array is being operated.

3. The LED driving apparatus of claim 2, configures so that the current control circuit stops operation when the first LED array operates together with a second LED array.

4. The LED driving apparatus of claim 1, wherein the current control circuit is connected to the output terminal of the first LED array and an output terminal of a second LED array connected to the first LED array in series.

5. The LED driving apparatus of claim 4, wherein the current control circuit includes at least one external switching element, and
   wherein an input terminal, a control terminal, and an output terminal of the external switching element are respectively connected to the output terminal of the first LED array, the output terminal of the second LED array, and a ground terminal.

6. The LED driving apparatus of claim 4, wherein
   the controller IC includes first and second internal switches respectively connected to the output terminal of the first LED array and the output terminal of the second LED array, and
   wherein the LED driving apparatus is configured such that when the first internal switch is turned on, the current control circuit draws a portion of the current flowing to the first LED array, and when the second internal switch is turned on, the current control circuit supplies the current flowing in the first LED array to the second LED array.

7. The LED driving apparatus of claim 1, wherein each of the plurality of LED arrays includes at least one LED, and a number of LEDs included in the first LED array is greater than numbers of LEDs included in each of other LED arrays of the plurality of LED arrays.

8. The LED driving apparatus of claim 1, wherein the power supply circuit includes a rectifying circuit configured to rectify alternating current (AC) power and a compensation circuit configured to supply predetermined compensation power to the first LED array when an output voltage from the rectifying circuit is smaller than a minimum voltage required for driving the first LED array.

9. The LED driving apparatus of claim 8, wherein the compensation circuit includes a valley-fill circuit.

10. The LED driving apparatus of claim 1, further comprising a voltage detection circuit configured to detect a voltage of the driving power.

11. A lighting device comprising:
    a light source including first to nth light emitting diode (LED) arrays connected in series;
    a power supply circuit having a rectifying circuit configured to rectify alternating current (AC) power and a compensation circuit configured to supply predetermined compensation power to the first LED array when an output voltage from the rectifying circuit is smaller than a minimum voltage required for driving the first LED array;
    a controller integrated circuit (IC) including first to nth internal switches respectively connected to output terminals of the first to nth LED arrays, and configured to control a path of current flowing in the first to nth LED array by adjusting operations of the first to nth internal switches based on a magnitude of a voltage supplied by the power supply circuit to the light source; and
    a current control circuit connected to an output terminal of the first LED array and configured to draw a portion of current flowing in the first LED array when the predetermined compensation power is supplied to the first LED array.

12. The lighting device of claim 11, configured so that when the output voltage from the rectifying circuit is greater than the minimum voltage required for driving the first LED array, the current control circuit supplies the current flowing in the first LED array to a second LED array connected in series to the first LED array.

13. The lighting device of claim 11, wherein the current control circuit includes at least one external switching element, and the at least one external switching element is connected between the output terminal of the first LED array and an output terminal of a second LED array connected in series to the first LED array.

14. The lighting device of claim 11, wherein the first LED array constantly operates while the power supply circuit supplies the voltage to the light source.

15. The lighting device of claim 11, wherein a number of LEDs included in the first LED array is greater than numbers of LEDs included in each of the second to nth LED arrays.

16. A light emitting diode (LED) driving apparatus comprising:
    a power supply circuit configured to supply driving power to a first LED array and a second LED array;
    a controller integrated circuit (IC) including a first internal switch and a second internal switch and configured to control operations of the first internal switch and second internal switch based on a magnitude of the driving power; and
    a current control circuit connected to an output terminal of the first LED array and an output terminal of the second LED array and configured to adjust current flowing to the first LED array,
    wherein while the driving power is supplied, the first LED array is constantly driven.

17. The LED driving apparatus of claim 16, wherein the first LED array and the second LED array are connected in series.

18. The LED driving apparatus of claim 16, wherein the first internal switch is connected to the output terminal of the first LED array and the second internal switch is connected to the output terminal of the second LED array,
    wherein the LED driving apparatus is configured so that:
        when the first internal switch is turned on, the current control circuit draws a portion of the current flowing to the first LED array, and when the second internal switch is turned on, the current control circuit supplies the current flowing in the first LED array to the second LED array.

19. The LED driving apparatus of claim 16, wherein the power supply circuit includes a rectifying circuit configured to rectify alternating current (AC) power and a compensation circuit configured to supply predetermined compensation power to the first LED array when an output voltage from the rectifying circuit is smaller than a minimum voltage required for driving the first LED array.

20. The LED driving apparatus of claim 16, wherein a number of LEDs included in the first LED array is greater than a number of LEDs included in the second LED array.

* * * * *